(12) United States Patent
Hidaka

(10) Patent No.: US 6,329,231 B1
(45) Date of Patent: Dec. 11, 2001

(54) DISTRIBUTED CONSTANT CIRCUIT WITH ACTIVE ELEMENT

(75) Inventor: Norio Hidaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/579,271

(22) Filed: May 26, 2000

(30) Foreign Application Priority Data

May 31, 1999 (JP) .................................................. 11-151174

(51) Int. Cl.[7] .................................................. H01L 21/338
(52) U.S. Cl. .......................... 438/167; 438/172; 257/194
(58) Field of Search .................................... 438/167, 172; 257/194; 330/300

(56) References Cited

U.S. PATENT DOCUMENTS

| | | | |
|---|---|---|---|
| 5,805,023 | * | 9/1998 | Fukuden ................................. 330/302 |
| 6,075,414 | * | 6/2000 | Nagaoka et al. ...................... 330/284 |

FOREIGN PATENT DOCUMENTS

| | | | |
|---|---|---|---|
| 63-216380-a | * | 9/1988 (JP) ................................ H01L/29/80 |
| 2000-340788-A | * | 5/1999 (JP) .............................. H01L/29/778 |

OTHER PUBLICATIONS

Yang et al. "A compact and wideband GaAs–hemt distributed amplifier IC based on a Micro–machined CPW" IEEE MTT–S digest 0–7803–5687–x/00 pp. 213–216. No date.*

* cited by examiner

*Primary Examiner*—Matthew Smith
*Assistant Examiner*—Granvill Lee, Jr.
(74) *Attorney, Agent, or Firm*—Armstrong, Westerman, Hattori, McLeland & Naughton, LLP

(57) ABSTRACT

An active element has first and second regions and a control electrode. Carriers move between the first and second regions in a first direction. A motion of carriers is controlled by an electric signal applied to the control electrode. The first and second regions and control electrode extend in a second direction crossing the first direction from an input terminal to an output terminal. A conductive region is electrically connected to the first region from the input terminal to the output terminal. A trigger line extending in the second direction propagates an electric signal from the input terminal to the output terminal. The electric signal propagating the trigger line is applied to the control electrode at a corresponding position in the second direction. An output line extending in the second direction propagates an electric signal from the input terminal to the output terminal. An electric signal propagating on the output line is excited by carriers moving through the active element in the first direction.

14 Claims, 17 Drawing Sheets

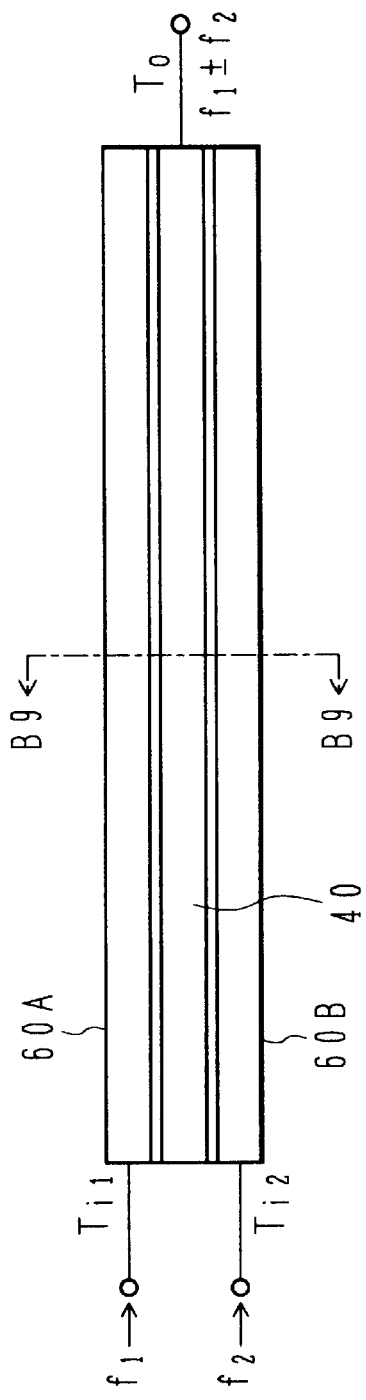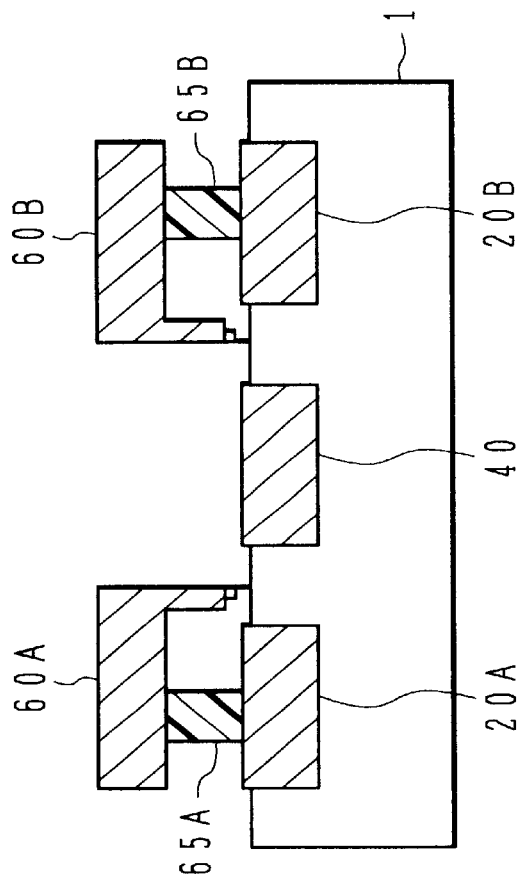

DISTRIBUTED CONSTANT CIRCUIT WITH ACTIVE ELEMENT

This application is based on Japanese Patent Application HEI 11-151174, filed on May 31, 1999, the entire contents of which are incorporated herein by reference.

BACKGROUND OF THE INVENTION a) Field of the Invention

The present invention relates to a negative resistance line using an active element having at least three terminals.

b) Description of the Related Art

Ultra high speed pulse transmission techniques in the order of 100 G bits/sec are being developed in the age of high capacity and high speed communications. In order to transmit a pulse at such high speed, an ultra broadband amplifier is required which has a gain-bandwidth product in the order of tera Hz and is terminated at 50Ω without power reflection. In order to meet such requirements, a distributed progressive wave amplifier using high performance high electron mobility transistors (HEMT) are being developed. A gain-bandwidth product of 150 GHz can be realized by a distributed progressive wave amplifier using HEMTs.

Although the gain-bandwidth product of 150 GHz can be obtained by a distributed progressive amplifier using HEMTs, its power gain is smaller than a performance expected from a cutoff frequency $f_t$ of HEMT and distributed constant effects. The reasons of the lower performance than expected may be no incorporation of distributed constants into each HEMT, a limit of the number of cascade connections, a limit of fine segmentation of a line length, a mutual conductance $G_m$ lowered by a phase matching gate stub line, and the like.

SUMMARY OF THE INVENTION

It is an object of the present invention to provide a distributed constant line applicable to an ultra broadband amplifier.

According to one aspect of the present invention, there is provided a distributed constant line comprising: an active element including first and second regions and a control electrode, carriers moving between the first and second regions in a first direction and a motion of carriers being controlled by an electric signal applied to the control electrode, the first and second regions and the control electrode extending in a second direction crossing the first direction from an input terminal to an output terminal; a conductive region electrically connected to the first region from the input terminal to the output terminal; a trigger line extending in the second direction for propagating an electric signal from the input terminal to the output terminal in the second direction, the electric signal propagating the trigger line being applied to the control electrode at a corresponding position in the second direction; and an output line extending in the second direction for propagating an electric signal from the input terminal to the output terminal in the second direction, the electric signal propagating on the output line in the second direction being excited by carriers moving through the active element in the first direction.

The electric signal propagating along the trigger line in the second direction controls a motion of carriers of the active element at each position in the second direction. An amplified electric signal therefore appears on the output line and propagates along the output line in the second direction. By properly setting the performance of the active element and the wavelength constant of each line, a negative resistance line can be obtained.

BRIEF DESCRIPTION OF THE DRAWINGS

FIGS. 9A and 9B are respectively a plan view and a cross sectional view of a negative resistance line according to a fifth embodiment.

DETAILED DESCRIPTION OF THE PREFERRED EMBODIMENTS

Figure 1:
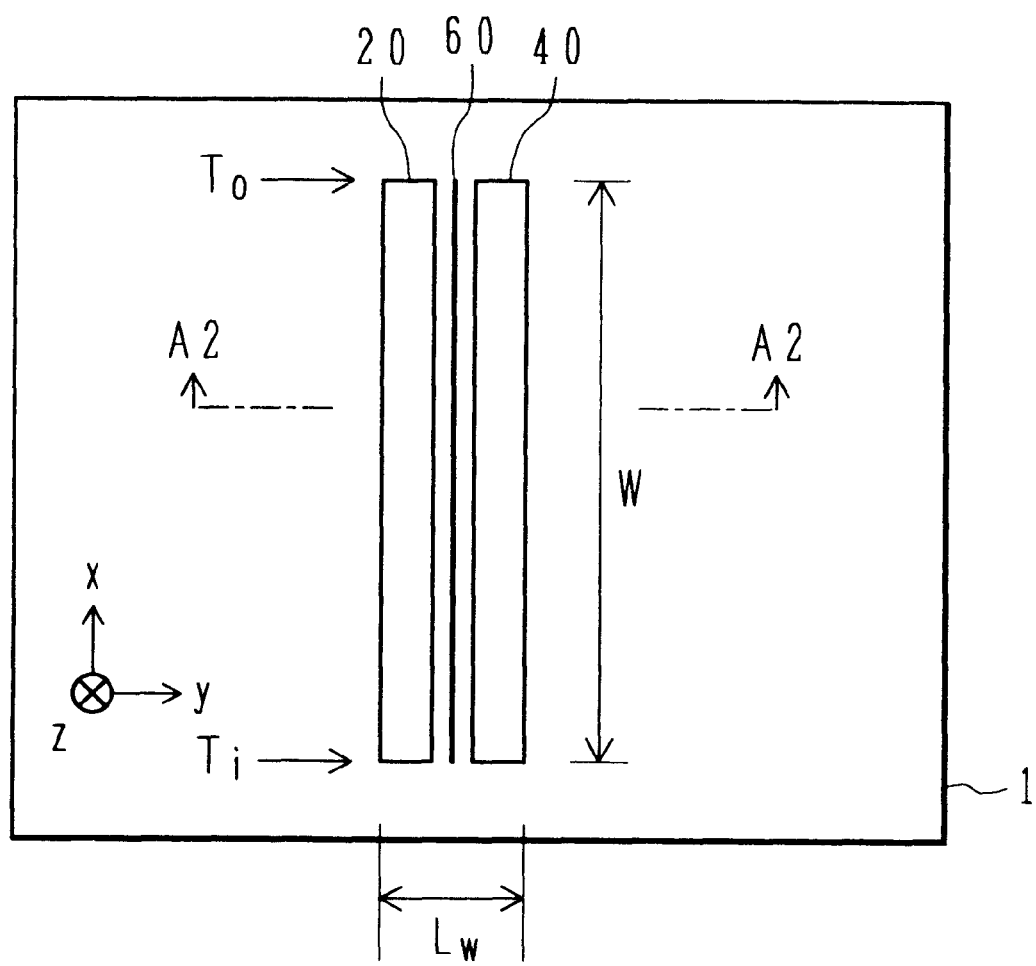
FIG. 1 is a plan view of a negative resistance line according to a first embodiment of the invention.

FIG. 1 shows a layout of a negative resistance line on a substrate surface according to the first embodiment of the invention. Consider an x-y-z orthogonal coordinate system having the substrate surface as its x-y plane and a down direction of a norm to the substrate surface as its z-axis. A common line 20 and an output line 40 are disposed in parallel along the x-axis direction from an input terminal $T_i$ to an output terminal $T_o$, with some space being set therebetween. A trigger line 60 contacts a region between the common line 20 and output line 40. Each of these lines has a length W in the x-axis direction. $L_w$ is a total width from one side of the common line 20 to one side of the output line 40.

Figure 2A:
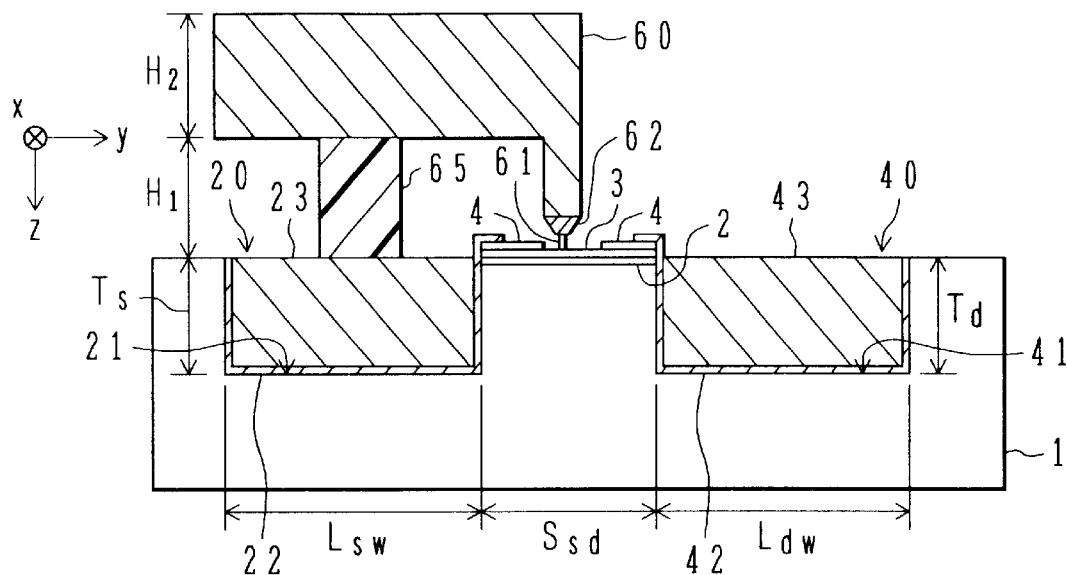
FIGS. 2A and 2B are cross sectional views of the negative resistance line of the first embodiment.
Figure 2B:
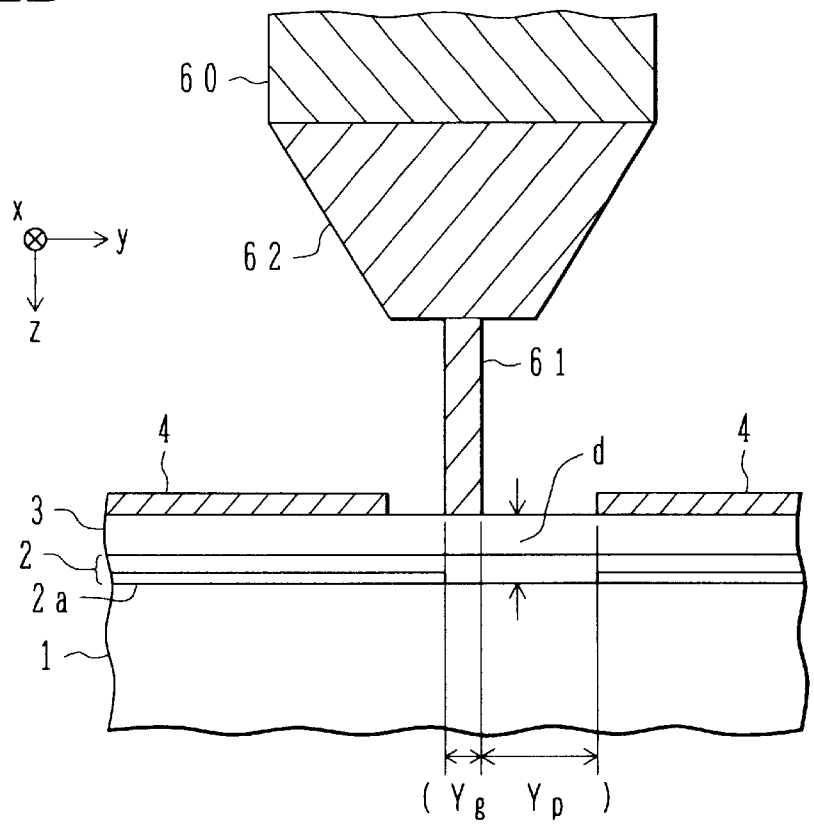

FIG. 2A is a cross sectional view taken along one-dot chain line A2—A2 shown in FIG. 1, and FIG. 2B is an enlarged view showing the trigger line and its nearby area. In the surface layer of a non-doped GaAs substrate 1, two grooves 21 and 41 parallel to the x-axis are formed. Bottom and side surfaces of the grooves 21 and 41 are covered with conductive films 22 and 42 each having a lamination structure of an AuGe film and an Au film. The grooves 21 and 41 are respectively filled with conductive members 23 and 43 of Au. The conductive film 22 and conductive member 23 constitute the common line 20, and the conductive film 42 and conductive member 43 constitute the output line 40.

On the surface of the substrate 1 between the grooves 21 and 41, a non-doped InGaAs layer 2 and an AlGaAs layer 3 having an Si concentration of $2\times10^{18}$ cm$^{-3}$ are laminated. A gate finger 61 is in Schottky contact with the surface of the AlGaAs layer 3 in a linear stripe area parallel to the x-axis, at an approximately central position between the grooves 21 and 41. On this gate finger 61, a gate umbrella 62 is disposed. The gate umbrella 62 extends on both sides of the gate finger 61 in the form of eaves. The gate finger 61 and gate umbrella 62 are made of Al.

An n$^+$-type GaAs layer 4 covers the surface of the AlGaAs layer 3 in the area other than the nearby area of an area where the gate finger 61 contacts. The n$^+$-type GaAs layer 4 is doped with Si at $2\times10^{18}$ cm$^{-3}$. The conductive films 22 and 42 covering the inner surface of the grooves 21 and 41 also cover partial surface areas of the n$^+$-type GaAs layer 4.

Two-dimensional electron gas 2a is accumulated at an interface between the GaAs substrate 1 and InGaAs layer 2. Two-dimensional electron gas 2a is electrically connected to the common line 20 and output line 40 at the sides of the grooves 21 and 41.

A region from under the gate finger 61 to the edges of the n$^+$-type GaAs layer 4 is depleted. Consider an operation under the conditions that 0 V is applied to the common line 20, a bias voltage of −1 V is applied the gate finger 61, and a bias voltage of +3 V is applied to the output line 40. In this case, a voltage between the gate finger 61 and common line 20 is 1 V, and a voltage between the gate finger 61 and output line 40 is 4 V. Since the voltage between the gate finger 61 and output line 40 is higher than the voltage between the common line 20 and gate finger 61, the depleted region extends longer to the output line 40 than to the common line 20.

The trigger line 60 made of Al is disposed over the common line 20. The trigger line 60 is supported by columns 65 made of low dielectric constant material to maintain a constant space of the trigger line 60 from the common line 20. The columns 65 are dispersively disposed along the x-axis. The trigger line 60 extends to the upper area of the gate umbrella 62, and hangs down to the gate umbrella 62 to contact the upper surface of the umbrella 62.

As shown in FIG. 2A, the widths of the common line 20 and output line 40 in the y-axis direction are respectively represented by $L_{sw}$ and $L_{dw}$, and a space between the common line 20 and output line 40 is represented by $S_{sd}$. A total sum of $L_{sw}$, $L_{dw}$ and $S_{sd}$ is the total width $L_w$ shown in FIG. 1. $T_s$, and $T_d$ are respectively the thicknesses of the common line 20 and output line 40 in the z-axis direction. $H_1$ is a space between the common line 20 and trigger line 60, and $H_2$ is a thickness of the trigger line 60 in the z-axis direction.

As shown in FIG. 2B, the width of the gate finger 61 at the contact portion with the AlGaAs layer 3, i.e., the gate length, is represented by $Y_g$. A distance between the gate finger 61 and the edge of the n$^+$-type GaAs layer 4 on the side of the output line 40, i.e., a distance between the Schottky contact and the two-dimensional electron gas on the drain side, is represented by $Y_p$.

As seen from FIGS. 2A and 2B, a HEMT is formed having as its source region a two-dimensional electron gas layer 2a on the side of the common line 20, as its drain region a two-dimensional electron gas layer 2a on the side of the output line 40, and as its gate electrode the gate finger 61. The carrier moving direction of this HEMT is parallel to the y-axis.

Figure 3:
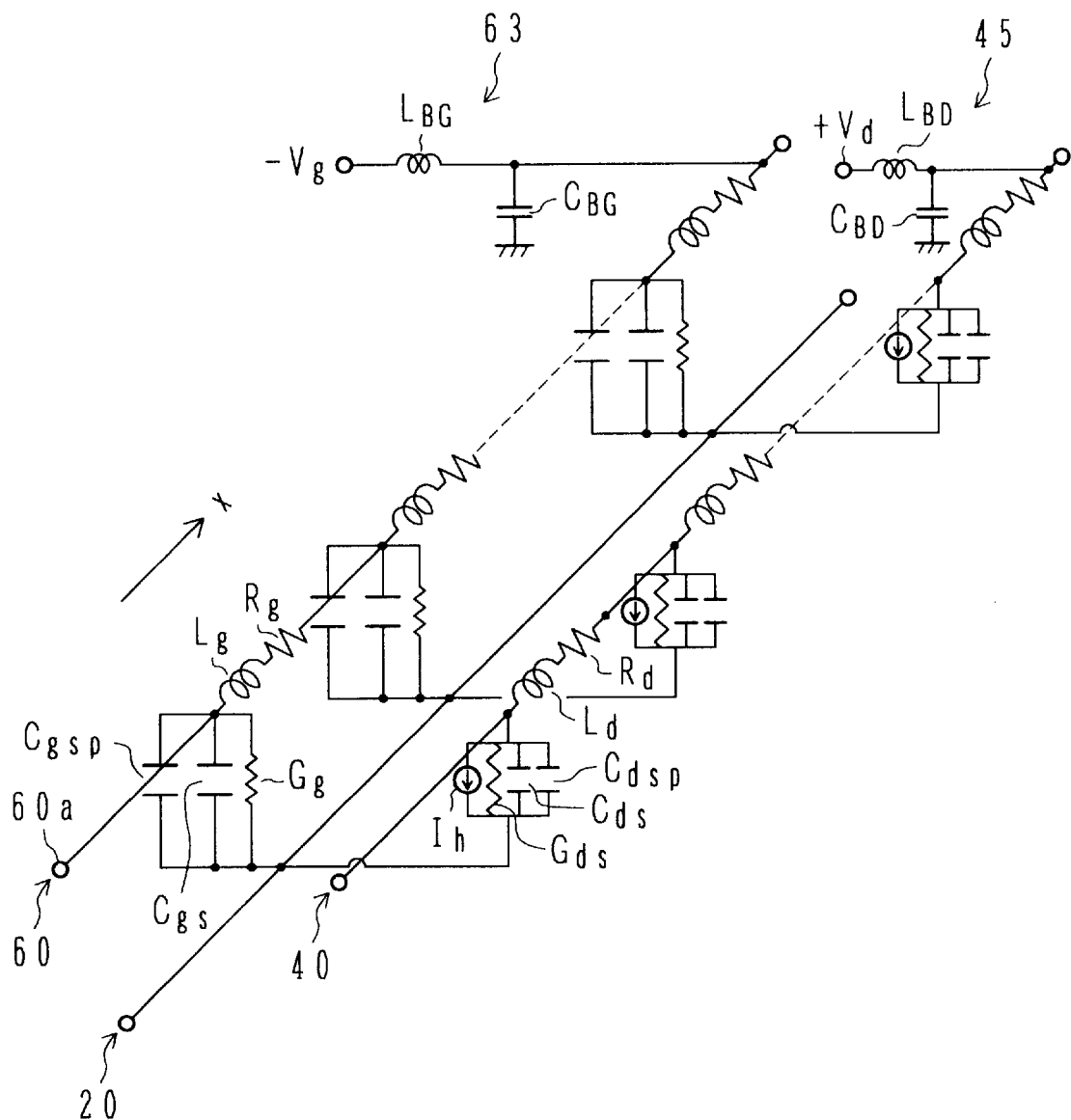
FIG. 3 is an equivalent circuit diagram of the negative resistance line of the first embodiment.

FIG. 3 is an equivalent circuit diagram of the negative resistance line shown in FIGS. 1, 2A and 2B in terms of distributed constants in the x-axis direction. HEMT is represented by a plurality of small signal equivalent circuits. A capacitor $C_{gs}$ in the equivalent circuit corresponds to a capacitance defined between the gate finger 61 and two-dimensional electron gas 2a, and a capacitor $C_{gsp}$ corresponds to a capacitance defined between the common line 20 and trigger line 60 shown in FIG. 2A. An inductor $L_g$ and a resistor $R_g$ correspond to an inductance and a resistance of the trigger line 60 shown in FIG. 2B, respectively.

A gate bias voltage $-V_g$ is applied to the trigger line 60 via a bias circuit 63. A drain bias voltage $+V_d$ is applied to the output line 40 via a bias circuit 45. The bias circuit 63 is constituted of a parallel capacitor $C_{BG}$ and a serial inductor $L_{BG}$, and the bias circuit 45 is constituted of a parallel capacitor $C_{BD}$ and a serial inductor $L_{BD}$.

A trigger signal is applied to the input terminal 60a of the trigger line 60. The applied trigger signal propagates along the trigger line 60 in the x-axis direction. The signal propagating along the trigger line 60 operates as the gate voltage applied to HEMT. With this gate voltage $V_g$, a current source $I_h$ supplies a signal current $G_m V_g$ to a distributed output line 40. $G_m$ is a mutual conductance of HEMT. There is a delay time $\tau_o$ until the signal applied to the trigger line 60 reaches the output line 40. This delay time $\tau_o$ is constant with respect to the x-axis direction.

A conductance $G_{ds}$ connected in parallel to the current source $I_h$ corresponds to a drain conductance between the source and drain of HEMT shown in FIG. 2A. A capacitance $C_{ds}$ connected in parallel to the current source $I_h$ corresponds a capacitance between the common line 20 and output line 40, and a capacitor $C_{dsp}$ corresponds to a capacitor between the common line 20 and output line 40. The inductor $L_d$ and resistor $R_d$ correspond to the characteristic impedance of the output line 40 in terms of distributed constants.

Figure 4:
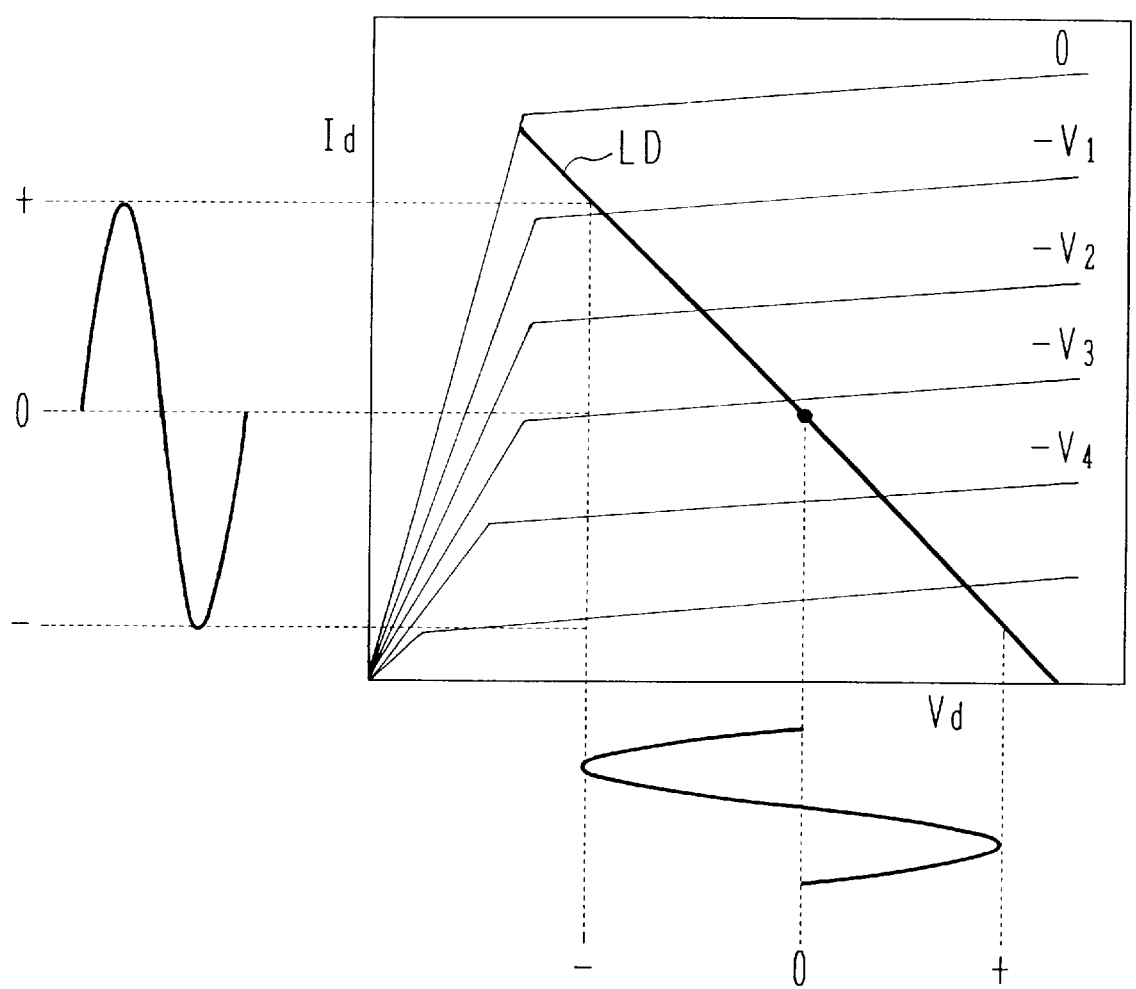
FIG. 4 is a graph showing the drain voltage-current characteristics of HEMT constituting the negative resistance line of the first embodiment.

FIG. 4 is a graph showing the drain current-voltage characteristics when an ac trigger signal is applied to the equivalent circuit shown in FIG. 3. Since the drain voltage and drain current change along a load line LD, an ac change rate $(\Delta v_d / \Delta i_d)$ is negative. Namely a negative resistance is equivalently observed. A slope of the load line LD is defined by the characteristic impedance of the output line 40, and an operating point is defined by the bias voltages $-V_g$ and $+V_d$. If the phases of signal waves propagating over the trigger line and output line can be made equal, a substantial negative resistance can be formed between the source and drain. Namely, the negative resistance can be formed by making the wavelength constants of the trigger line and output line approximately equal.

From the equivalent circuit shown in FIG. 3, the following fundamental equations for voltage and current waves can be derived.

$$dV_d/dx = -Z_d I_d \qquad (1)$$

$$dI_d/dx = -(Y_d V_d + G_m V_g) \qquad (2)$$

$$Y_g = G_g + j\omega C_{gs}$$

$$Z_g = R_g + j\omega L_g$$

$$Y_d = G_{ds} + j\omega C_{ds}$$

$$Z_d = R_d + j\omega L_d$$

$V_d$ and $I_d$ respectively represent the voltage and current of the output line 40 at a position x. It is assumed herein that the effects of the capacitors $C_{gsp}$ and $C_{dsp}$ are not considered.

The second term of the right side of the equation (2) represents a current source important to realize a negative resistance. From the equations (1) and (2), the following second order differential equation is obtained which expresses a voltage signal wave propagating over the output line 40.

$$(d/dx)^2 V_d = Z_d Y_d V_d + Z_d G_m V_g \quad (3)$$

Since the drain voltage $V_d$ is 0 at the signal input terminal of the trigger line 60, the boundary condition can be expressed by:

$$V_d(x=0)=0.$$

Under this boundary condition, the second order differential equation (3) can be solved with $V_g = V_{GO} \exp(-\gamma_g x)$ as in the following:

$$V_d = -Z_c G_m / [\gamma_d \{(\gamma_g/\gamma_d)^2 - 1\}] \cdot V_{GO} \exp(-\gamma_g x)[\exp(-(\gamma_d - \gamma_g)x - 1)] \quad (4)$$

$Z_c$ is a characteristic impedance of the output line 40, $\gamma_d$ is a propagation constant of the output line 40, $\gamma_g$ is a propagation constant of the trigger line 60, and $V_{GO}$ is a voltage of the trigger line 60 at the input terminal (x=0). $Z_c$, $\gamma_d$ and $\gamma_g$ are respectively expressed as:

$$Z_c = (Z_d/Y_d)^{1/2}$$

$$\gamma_d = (Z_d Y_d)^{1/2}$$

$$\gamma_g = (Z_g Y_g)^{1/2}$$

At an infinite of $(\gamma_g/\gamma_d) \square 1$, the equation (4) can be expressed at the output terminal (x=W) of the output line 40 as:

$$V_d = (Z_c G_m/2) V_{GO} \exp(-\gamma_g W) \quad (5)$$

The characteristic impedance $Z_c$ obtained from the equations (1) and (4) is:

$$Z_c = -(V_d/I_d) \quad (6)$$

It can be understood from the above equation that the effective characteristic impedance is negative. A power $P_i$ at the input terminal (x=0) and a power $P_o$ at the output terminal (x=W) are expressed by:

$$P_i = (V_{GO}^2/Z_g)$$

$$P_o = (V_d^2/Z_g)$$

If the characteristic impedances of the trigger line 60 and output line 40 are equal, i.e., if $Z_g = Z_d = Z_c$, then a power gain $G_{max} = P_o/P_i$ is given by:

$$G_{max} = (Z_c G_m W)^2 \exp(-2\gamma_g W)/4$$

$$\gamma_g = \alpha_g + j\beta_g$$

where $\alpha_g$ is an attenuation constant of the trigger line 60.

If the attenuation constant $\alpha_g$ is sufficiently small, it is possible to approximate as in the following:

$$\exp(-2\gamma_g W) = 1 - 2\gamma_g W$$

$$\alpha_g = (\tfrac{1}{2})(R_g/Z_c)$$

Therefore, by adopting only the real part $\alpha_g$ of the propagation constant $\gamma_g$ regarding gain, a power gain can be expressed by:

$$G_{max} = (G_m Z_c W)^2 (\tfrac{1}{4})(1 - 2\alpha_g W) \quad (8)$$

There is a following relation between the characteristic line impedance $Z_c$, an intrinsic capacitance $C_{gs}$ between source and drain, and a phase velocity $v_s$:

$$Z_c = 1/(C_{gs} v_s)$$

By using this relation, the equation (8) is rearranged as:

$$G_{max} = [(2\pi f_T/v_s)W]^2 (\tfrac{1}{4})[1 - (R_g/Z_c)W] \quad (9)$$

where relations of $f_T = G_m/(2\pi C_{gs})$ and $\alpha_g = (\tfrac{1}{2})R_g/Z_c$ are used.

A phase velocity $v_s$ is expressed as:

$$v_s = v_0/(\in_{eff})^{1/2}$$

where $v_0$ is a light velocity in vacuum, and $\in_{eff}$ is an effective specific dielectric constant. The effective specific dielectric constant $\in_{eff}$ is determined from a geometrical dimension of a transmission line.

The power gain $G_{max}$ given by the equation (9) is irrelevant to an operating frequency. In order to obtain a large power gain, it is preferable to make $C_{gs}$ smaller. In the above-described studies, the capacitor $C_{gsp}$ shown in FIG. 3 is neglected. If this capacitor $C_{gsp}$ is considered, an effective $C_{gs}$ becomes large. It is therefore preferable to make the capacitor $C_{gsp}$ as small as possible.

The power gain $G_{max}$ does not depend upon the drain conductance $G_{ds}$ shown in FIG. 3. This means that most of an output energy are transported by charge/discharge by the capacitance and inductance of the output line 40. The output line 40 is formed to satisfy the following conditions:

$$\omega L_d > R_d \text{ and } (1/\omega C_d) > G_{ds}$$

Next, the conditions of obtaining a power gain of the transmission line will be described. Consider the case wherein x=W and $\gamma_d W$ in the equation (4) is sufficiently large, then:

$$V_d = -(Z_c G_m/\gamma_d) V_{GO}$$

The characteristic impedance $Z_c$ and propagation constant $\gamma_d$ of the output line 40 for a dc signal are given by:

$$Z_c = (R_d/G_{ds})^{1/2}$$

$$\gamma_d = (R_d G_{ds})^{1/2}$$

The power gain for a dc signal is therefore:

$$G_{max} = (G_m/G_{ds})^2$$

In this case, it is assumed that $Z_c = Z_d = Z_g$.

In order to have a power gain for a dc signal larger than 1, the following relation between the mutual conductance $G_m$ and drain conductance $G_{ds}$ is required to be satisfied:

$$G_m > G_{ds}$$

This means that in order to obtain a power gain, the power driven by the trigger line is required to be larger than the power consumed by the drain conductance $G_{ds}$. Namely, in order to realize an equivalent negative resistance line in a broad frequency range from a dc to a high frequency, it is necessary to make the mutual conductance $G_m$ larger than the drain conductance $G_{ds}$.

Next, the signal delay time $\tau_o$ in the y-axis direction shown in FIG. 2A will be described. A spatial length in the y-axis direction is represented by $l_o$, and a wavelength reduction ratio of medium (corresponding to the AlGaAs layer 3 in an example shown in FIG. 2B) is represented by K. The effective length $l_s$ is represented as $l_s=l_o/K$. If the effective specific dielectric constant of the medium is represented by $\in_{eff}$, the wavelength reduction rate K is about $(\in_{eff})^{1/2}$. Therefore, by using an angular velocity ω, the following relation is satisfied:

$$\omega\tau_o=\beta_o l_s$$

A current $G_m V_g$ from the current source $I_h$ is:

$$G_m V_g = G_{mo} V_{go} \exp(-\alpha_g W) \exp[-j\beta_g W\{(\beta_o l_s/\beta_g W)+1\}] \qquad (10)$$

where W is a gate width, $\beta^g$ is a wavelength constant of the trigger line 60, and $\beta_o$ is a wavelength constant of the medium. Generally, $l_s$ is not larger than 1 μm and W is 200 μm or wider. Therefore, $\beta_o l_s/\beta_g W$ is 0.005 or smaller. It can therefore be considered that the delay time $\tau_o$ hardly influences the current $G_m V_g$ from the current source $I_h$.

Since $\{(\beta_o l_s/\beta_g W)+1\}$ is an imaginary term, it does not influence a gain which takes a real part.

In a general HEMT, the delay time $\tau_o$ from the Schottky gate end to the two-dimensional electron gas on the drain side shown in FIG. 2B lowers the cutoff frequency $f_T$. It is not preferable to elongate $Y_p$ shown in FIG. 2B. As $Y_p$ is shortened, the capacitance $C_{gd}$ between gate and drain becomes large and $f_T$ lowers. From this reason, a desired length $Y_p$ is limited in some range. In contrast with this, the power gain of the embodiment is irrelevant to $Y_p$ and such a limit does not exist.

In a conventional HEMT, the gate width W is designed to be short in order to reduce a power loss to be caused by a bandwidth limit by phase rotation and an increase in the gate resistance $R_g$. In contrast with this, in this embodiment, the power gain increases as the gate width W is made wider as seen from the equation (9).

As described above, a negative resistance line can be equivalently realized by using a three-terminal element, e.g., HEMT ($G_m > G_d$) and by matching the phase velocities of signals propagating over a trigger line and an output line both connected to input/output terminals of HEMT and matching the characteristic impedance of the lines, respectively in terms of distributed constants.

Next, with reference to FIGS. 5A to 5N, an example of a method of manufacturing the negative resistance line of the embodiment will be described.

Figure 5A:
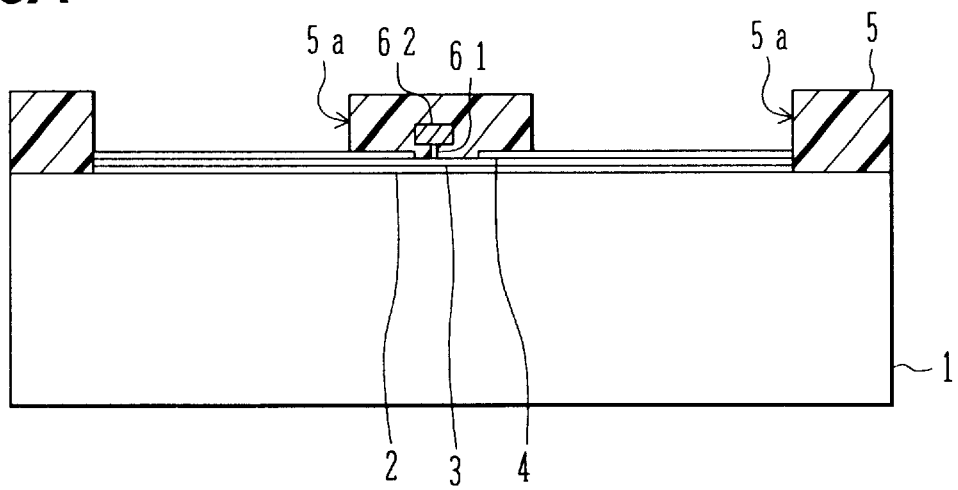
FIGS. 5A to 5N are cross sectional views of a substrate illustrating a method of manufacturing the negative resistance line of the first embodiment.

Processes to be executed to form the line shown in FIG. 5A will be first described. On the surface of a non-doped GaAs substrate 1, a non-doped InGaAs layer 2, an AlGaAs layer 3 having a Si concentration of 1 to $2\times10^{18}$ cm$^{-3}$, and an n$^+$-type GaAs layer 4 having a Si concentration of $2\times10^{18}$ cm$^{-3}$ are formed. For example, these layers are deposited by chemical vapor deposition (CVD) or molecular beam epitaxy (MBE).

An opening is formed through the GaAs layer 4 to expose the AlGaAs layer 3 on the bottom surface of the opening in which a gate finger is to be disposed. The InGaAs layer 2, AlGaAs layer 3 and GaAs layer 4 outside an area where the common line and output line are to be disposed, are removed.

A gate finger 61 and a gate umbrella 62 are formed. For example, the gate finger 61 and gate umbrella 62 are formed by laminating an electron beam exposure resist film with an opening corresponding to the gate finger 61 and an ultraviolet ray exposure resist film with an opening corresponding to the gate umbrella 62 and by executing a lift-off process. A method of forming a gate electrode having a similar shape is disclosed, for example, in FIG. 2 of JP-A-HEI-11-40577.

The whole substrate surface is covered with a resist film 5, and openings 5a corresponding to the common line and output line are formed through the resist film 5.

Figure 5B:
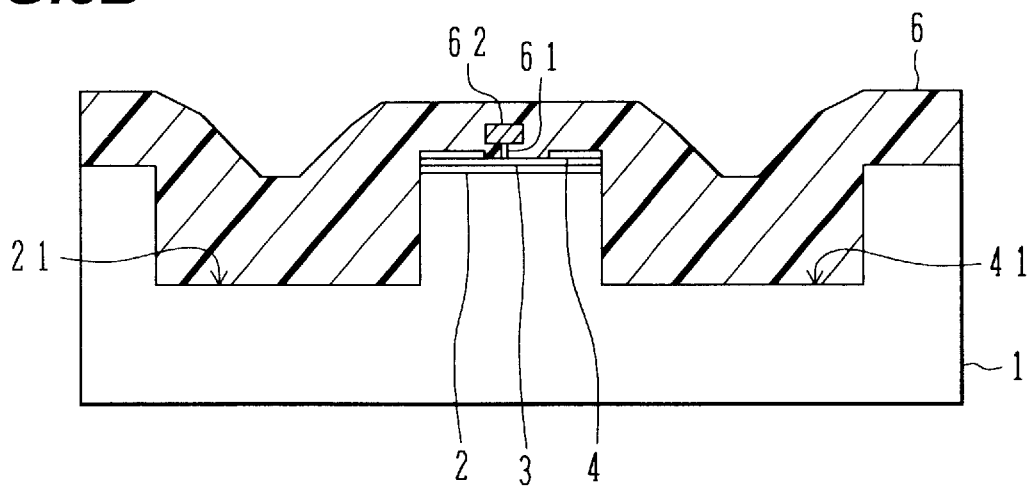

As shown in FIG. 5B, by using the resist film 5 as a mask, the GaAs layer 4, AlGaAs layer 3 and InGaAs layer 2 are etched to form grooves 21 and 41 in the GaAs substrate 1. This etching may be performed, for example, by dry etching using SiCl$_4$. After the grooves 21 and 41 are formed, the resist film 5 shown in FIG. 5A is removed. A new resist film 6 is formed covering the whole substrate surface.

Figure 5C:
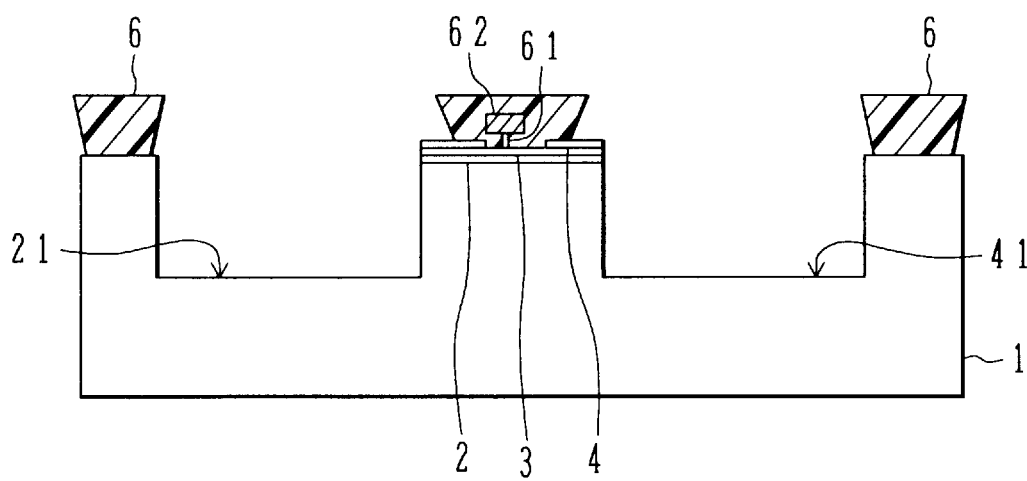

As shown in FIG. 5C, the resist film 6 is selectively exposed and developed to expose the inner surfaces of the grooves 21 and 41. The edges of the resist film 6 covering the substrate upper surface between the grooves 21 and 41 are being slightly retracted from the sides of the grooves 21 and 41.

Figure 5D:
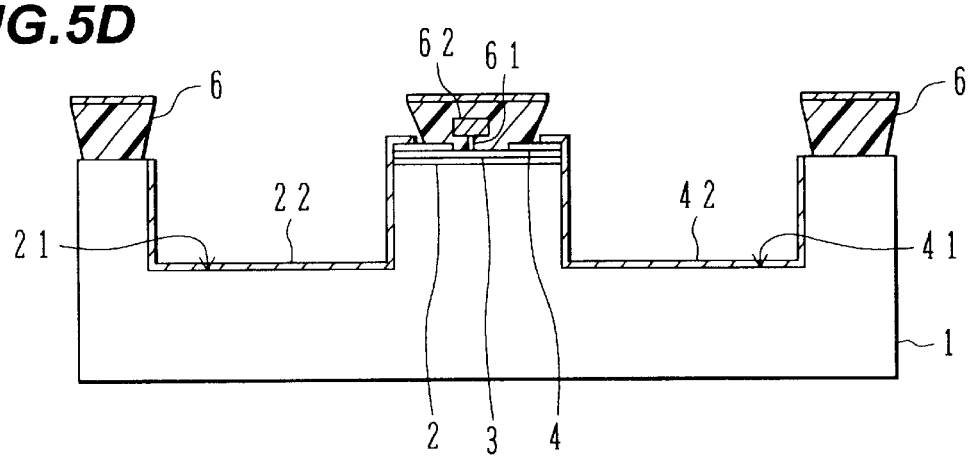

As shown in FIG. 5D, an AuGe layer and an Au layer are vapor deposited. The inner surfaces of the grooves 21 and 41 are respectively covered with conductive films 22 and 42 each constituted of the AuGe layer and Au layer. The sides of the InGaAs layer 2, AlGaAs layer 3 and GaAs layer 4 and the upper partial areas of the GaAs layer 4 are also covered with the conductive films 21 and 41. The AuGe layer and Au layer are also being deposited on the resist film 6. The resist film 6 is thereafter removed.

Figure 5E:
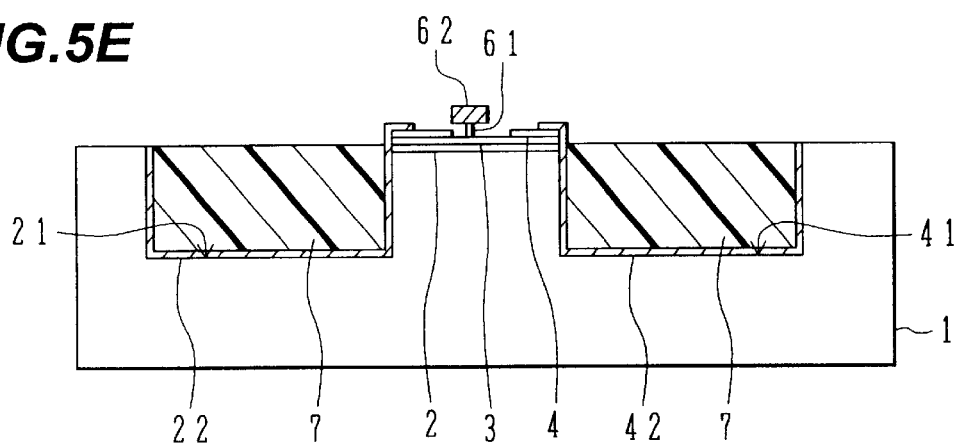

As shown in FIG. 5E, the insides of the grooves 21 and 41 are buried with a resist film 7. The resist film 7 can be buried by coating resist on the whole substrate surface and etching it back.

Figure 5F:
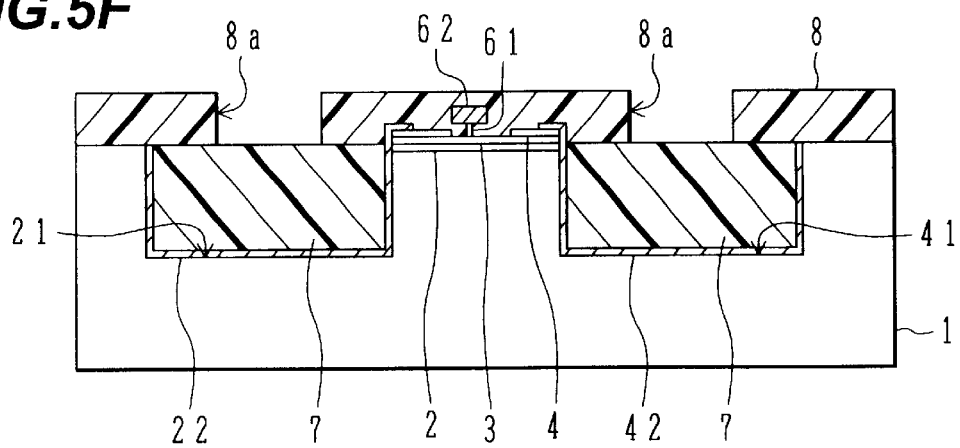

As shown in FIG. 5F, an electron beam exposure resist film 8 is formed covering the whole substrate surface. Openings 8a are formed through the resist film 8, exposing partial upper surfaces of the resist film 7 filled in the grooves 21 and 41.

Figure 5G:
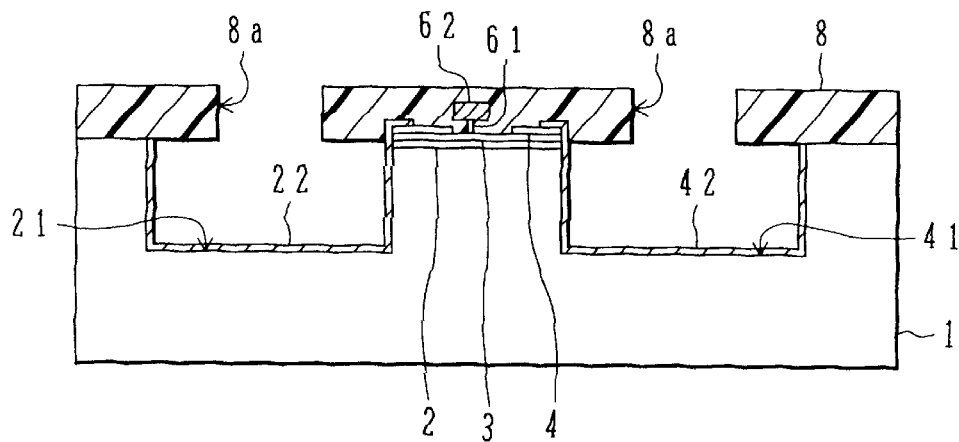

As shown in FIG. 5G, the resist film 7 burying the grooves 21 and 41 is removed. The insides of the grooves 21 and 41 are cleaned through nitrogen bubbling or washing with water.

Figure 5H:
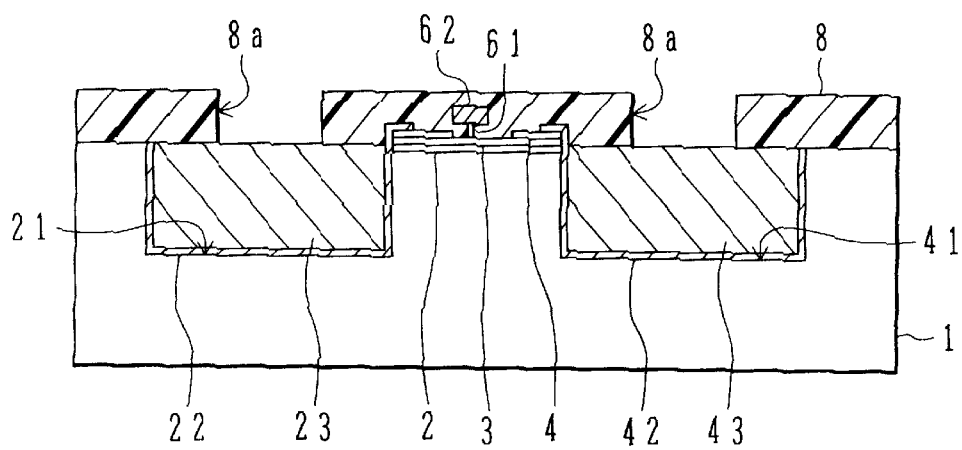

As shown in FIG. 5H, gold is plated on the inner surfaces of the grooves 21 and 41. The grooves 21 and 41 are therefore buried with conductive members 23 and 43 of Au. After the Au plating, the resist film 8 is removed.

Figure 5I:
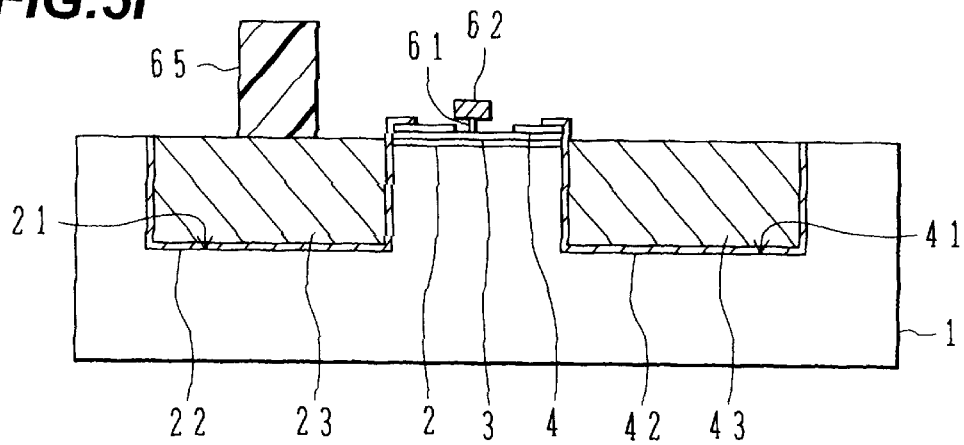

As shown in FIG. 5I, columns 65 of low dielectric material are formed on the conductive member 23. For example, the column 65 is formed by coating photosensitive polyimide on the whole substrate surface and exposing and developing it.

Figure 5J:
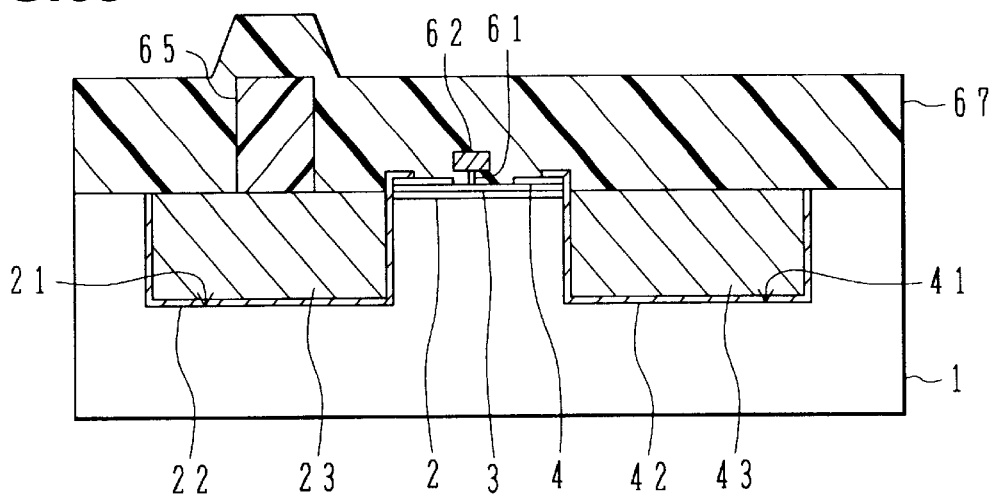
Figure 5K:
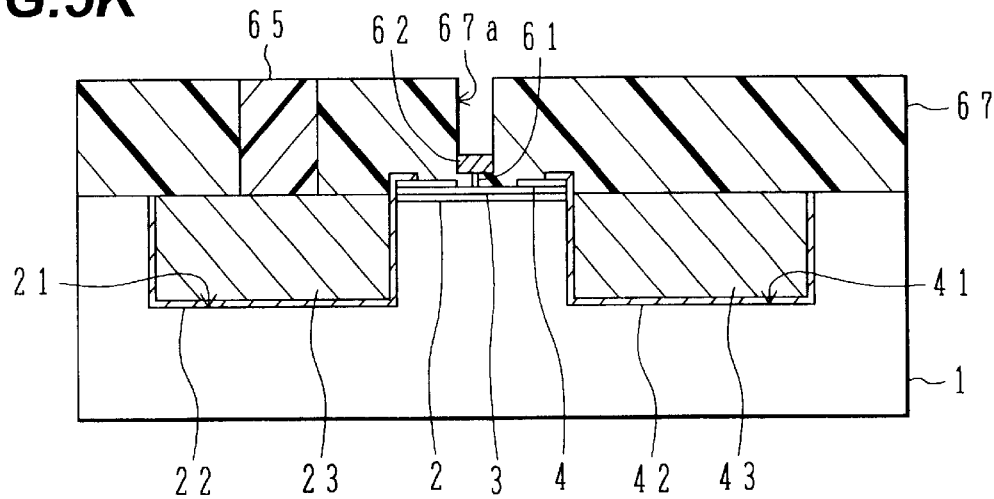

As shown in FIG. 5J, X-ray resist is coated over the substrate to form a resist film 67. As shown in FIG. 5K, the resist film 67 is exposed and developed to form an opening 67a exposing the upper surface of the gate umbrella 62 and expose the upper surface of the column 65.

Figure 5L:
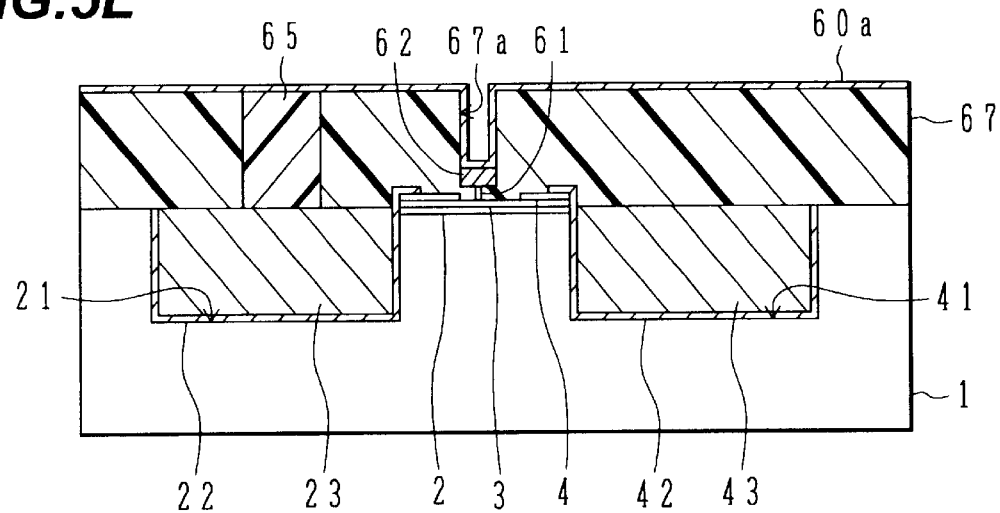

As shown in FIG. 5L, a gold film 60a is vapor deposited over the whole substrate surface. In this case, the gold film 60a is controlled to be attached to the inner surface of the opening 67a. The gold film may be formed by sputtering.

Figure 5M:
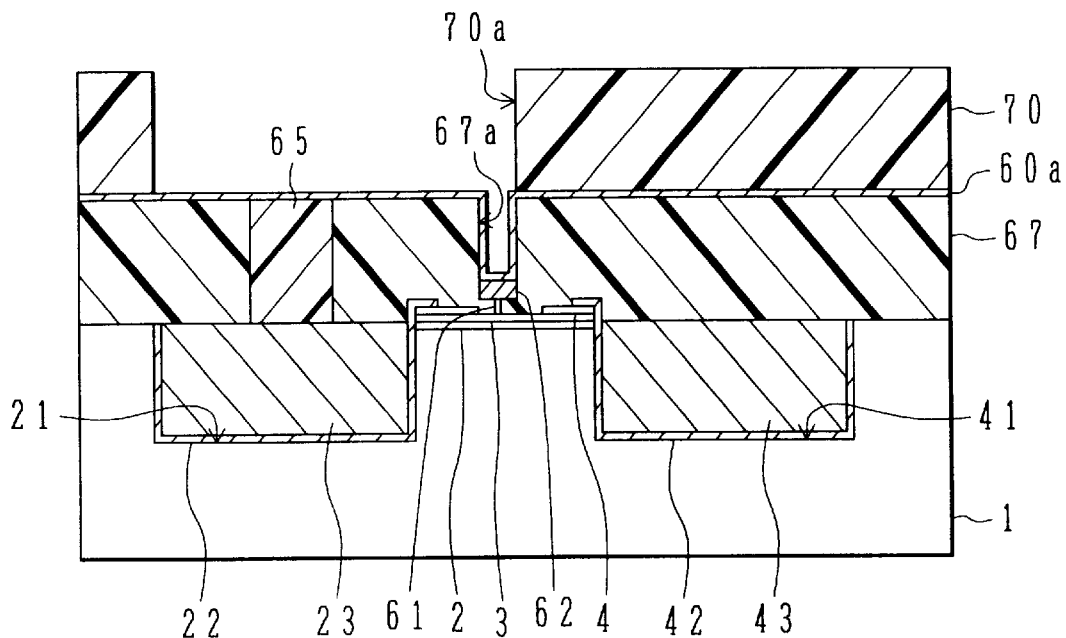

As shown in FIG. 5M, a resist film 70 is formed on the surface of the gold film 60a. The resist film 70 is exposed and developed to form an opening 70a extending from an upper area of the conductive member 23 to an upper area of the opening 67a.

Figure 5N:
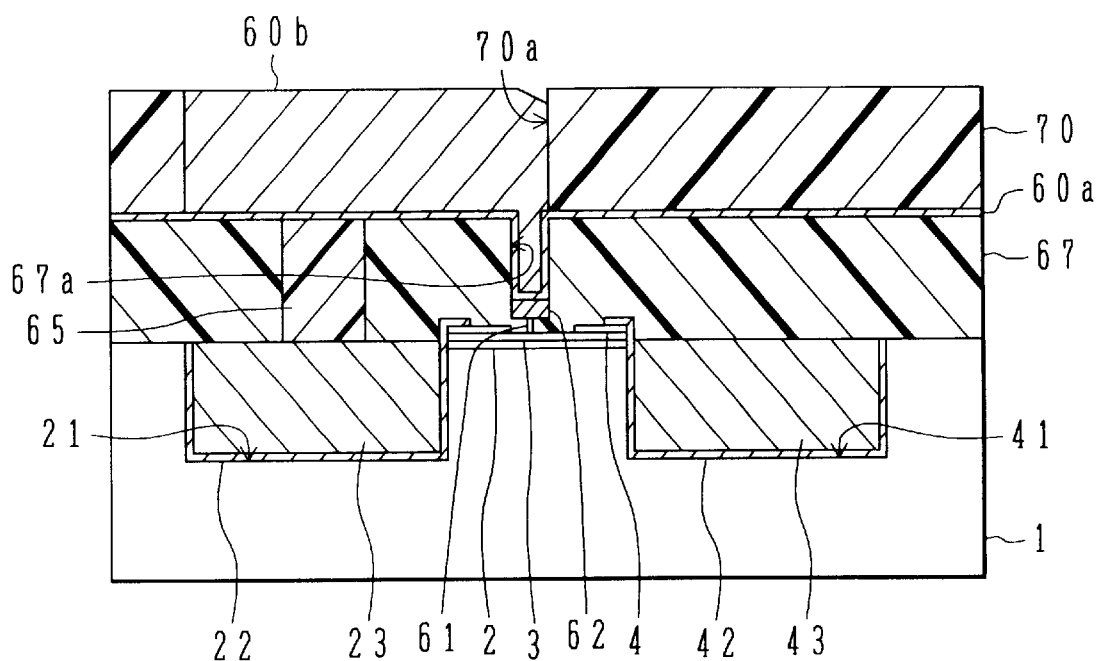

As shown in FIG. 5N, gold is plated to bury the opening 70a with a conductive member 60b of gold. Thereafter, the resist film 70 is removed and the exposed gold film 60a is removed by milling, and then the resist film 67 is removed. With the above-described processes, the negative resistance line shown in FIG. 2A can be obtained.

Reverting to FIGS. 2A and 2B and FIG. 3, the first embodiment will be described further. The characteristic impedances of the trigger line 60 and output line 40 shown in FIG. 3 are preferably set to 50Ω. The input/output impedances of most electronic apparatuses are set to 50Ω. By setting the characteristic impedances of the trigger line and output line to about 50Ω, the negative resistance line can be directly connected to most electronic apparatuses without using an impedance matching circuit.

This characteristic impedance is defined by the geometrical shape and size in the y-z plane shown in FIG. 2A. For example, if the relative dielectric constant of the InGaAs layer 2 and AlGaAs layer 3 shown in FIG. 2B is about 12, a ratio $Y_g/d$ of the gate length $Y_g$ to the total thickness d of the layers 2 and 3 is set to about 0.96. In a conventional unitary element, this ratio $Y_g/d$ is set to about 2 in order to alleviate the influence of a fringing capacitance. In this case, it is impossible to set the characteristic impedance to 50Ω because the gate/source capacitance $C_{gs}$ becomes too large. It is preferable to set the ratio $Y_g/d$ to about 0.8 to 1.2.

One of parameters which determine the characteristic impedance is the distributed capacitance such as source/gate capacitance $C_{gs}$, adjustment capacitance $C_{gsp}$, source/drain capacitance $C_{ds}$ and adjustment capacitance $C_{dsp}$. These capacitances are formed in the y-z cross section shown in FIG. 2A. The area in the x-y cross section occupied by an element defining the characteristic impedance can be made small. For example, as shown in FIG. 1, the negative resistance line can be disposed in a linear narrow area extending in the x-axis direction. The area occupying the substrate plane is about 1/40 to 1/50 of a matching circuit of a conventional distributed progressive wave amplifier.

The source/drain capacitance $C_{ds}$ of the single element shown in FIG. 2B is so small that it is difficult to set the characteristic impedance of the output line 40 to 50Ω by this capacitance only. As shown in FIG. 2A, by adding the adjustment capacitance $C_{dsp}$ between the common line 20 and output line 40, the characteristic impedance of the output line 40 can be set near to 50Ω. The adjustment capacitance $C_{dsp}$ is defined by the geometrical shape of the y-z cross section of the common line 20 and output line 40. More specifically, the adjustment capacitance $C_{dsp}$ is defined by the thickness $T_s$ and width $L_{sw}$ of the common line 20, the thickness $T_d$ and width $L_{dw}$ of the output line 40, a distance $S_{sd}$ between the common line 20 and output line 40, and the like.

By making the common line 20 and output line 40 thick, the adjustment capacitance $C_{dsp}$ can be made large. In this case, since the electric resistance of both the lines 20 and 40 in the x-axis direction becomes small, a propagation loss of a signal can be made small. The adjustment capacitance $C_{dsp}$ is a natural logarithm function of the widths $L_{sw}$ and $L_{dw}$ of the lines 20 and 40. Therefore, the adjustment capacitance $C_{dsp}$ changes gently with a change in the widths $L_{sw}$ and $L_{dw}$ of the lines 20 and 40. By adjusting the widths $L_{sw}$ and $L_{dw}$ of the lines 20 and 40, the adjustment capacitance $C_{dsp}$ can be adjusted finely.

Consider now that in FIG. 2B, $Y_p$=0.2 μm, d=40 nm and the relative dielectric constant of the InGaAs layer 2 and AlGaAs layer 3 is 12. Referring to FIG. 3, in order to make the characteristic impedance of the output line 40 approximately equal to that of the trigger line, the total capacitance of the source/drain capacitance $C_{ds}$ and adjustment capacitance $C_{dsp}$ is set to about 166 fF/mm. Since the source/drain capacitance $C_{ds}$ is about 20 fF/mm, a necessary adjustment capacitance $C_{dsp}$ is about 146 fF/mm. For example, the adjustment capacitance $C_{dsp}$ of about 146 fF/mm can be obtained by setting the thicknesses $T_s$ and $T_d$ of the common line 20 and output line 40 to 4 μm and the widths $L_{sw}$ and $L_{dw}$ of the lines 20 and 40 to 6 μm.

In order to form a capacitance of about 146 fF/mm on a substrate having a thickness of about 300 μm, a micro strip line of 280 μm in width and about 1 mm in length is required. The area of a typical surface matching circuit of a conventional distributed progressive wave amplifier is about 1×0.4 mm², and its plan shape is complicated. In the negative resistance line of this embodiment, a straight line having a width of 16 μm and a length of 1 mm can be used.

In this first embodiment, a signal applied to the input terminal of the trigger line 60 propagates along the trigger line 60 in the x-axis direction. This signal propagates in the width direction (y-axis direction) of the trigger line 60 and reaches the gate finger 61. The signal can propagate to the gate finger 61 with almost no voltage drop because the effective signal propagation length in the width direction is short. A power loss to be caused by charge/discharge of the gate/source capacitance $C_{gs}$ becomes almost negligible.

If the thickness $H_2$ of the trigger line 60 is 3 μm, the width is 6 μm, and the specific resistance ρ of gold is $2\times10^{-6}$ Ωcm, then the resistance of the trigger line 60 is 1Ω or smaller. In this case, the line attenuation constant $\alpha_g$ is 0.04 mm$^{-1}$ so that the propagation loss is 0.1 dB/mm or smaller. The resistance $R_g$ of only the gate finger 61 is 165Ω if the height of the gate umbrella 62 is 300 nm and the width is 400 nm. In this case, the attenuation constant $\alpha_g$ is 1.65 mm$^{-1}$ so that the propagation loss is 7 dB/mm. It can be understood that the structure of the first embodiment can lower the propagation loss.

The trigger line 60 is formed after the active element (HEMT in the first embodiment) is formed. It is therefore possible to make the line shape and size match the element characteristics after the characteristics of the active element are checked.

The trigger line 60 is stably supported on the substrate by the columns 65. A mechanical load exerted on the gate finger 61 can therefore be reduced. The columns 65 are disposed dispersively along the x-axis direction so that an increase of a capacitance between the trigger line 60 and common line 20 by the columns 65 is negligible According to the first embodiment, most of the electromagnetic energy are confined in the space between the trigger line 60 and common line 20 and in the space between the common line 20 and output line 60, and a signal propagates in the x-axis direction shown in FIG. 2A. Radiation of the electromagnetic energy to a free space can therefore be suppressed, and isolation between a plurality of lines disposed in close vicinity to each other can be easily realized. The attenuation constants of the trigger line 60 and output line 40 can be made small.

According to the first embodiment, as shown in FIG. 2A, the upper surface of the output line 40 is positioned lower than the upper surface of the n$^+$-type GaAs layer 4. A parasitic capacitance between the trigger line 60 and output line 40 can therefore be made small. By reducing the parasitic capacitance between the lines 60 and 40, it becomes possible to suppress the cutoff frequency $f_T$ of HEMT from being lowered.

For example, in FIG. 2A if $H_1$=$H_2$=3 μm, $S_{sd}$=4 μm and $L_{dw}$=$T_d$=3 μm, the parasitic capacitance (about 6.2 fF/mm)

between the trigger line 60 and output line 40 becomes about 1/20 of the intrinsic capacitance $C_{ds}$ under the conditions of $Y_p/d>2$ in FIG. 2B.

In FIG. 2B, a distance between the gate finger 61 and the two-dimensional electron gas layer 2a on the drain side is represented by $Y_p$ and a distance in the thickness direction between the gate finger 61 and the two-dimensional electron gas layer 2a is represented by d. A ratio $Y_p/d$ is preferably set to 2 or larger. In a general unitary HEMT, the signal delay time $\tau_o$ in the y-axis direction shown in FIG. 2B degrades the bandwidth characteristics of a power gain. From this reason, $Y_p$ is generally made as short as possible. In the first embodiment, as indicated by the equation (7), the power gain is not relevant to the delay time $\tau_o$. The ratio $Y_p/d$ can therefore be set large.

If the ratio $Y_p/d$ is made large, the fringing capacitance (capacitance between the Schottky gate and the drain side two-dimensional electron gas layer) becomes small. Isolation between the gate (trigger line) and drain (output line) can therefore be made high. As isolation therebetween is made high, it is possible to design the characteristic impedance of the trigger line and output line independently.

Figure 6:
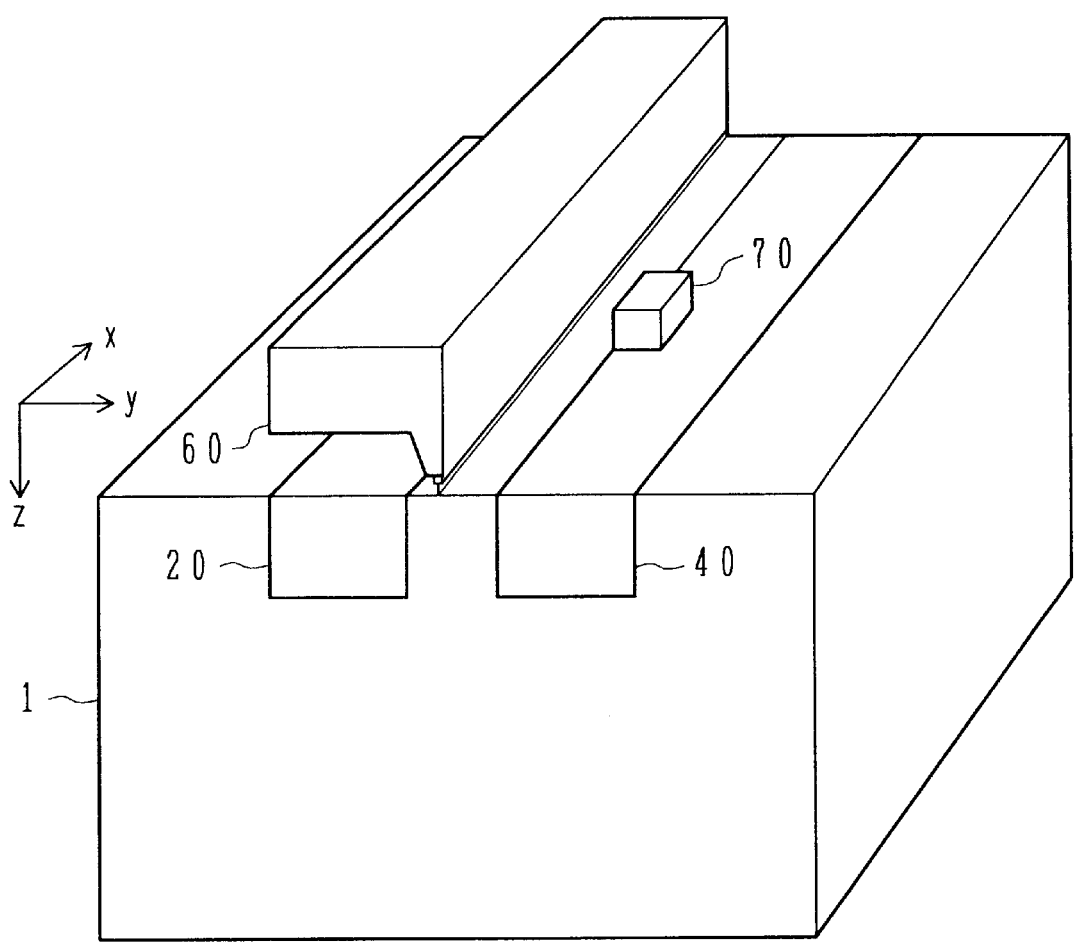
FIG. 6 is a perspective view of a negative resistance line according to a second embodiment.

FIG. 6 is a schematic perspective view of a negative resistance line according to the second embodiment. The structures of a GaAs substrate 1, a common line 20, an output line 40, and a trigger line 60 are similar to those of the first embodiment shown in FIG. 2A. In the second embodiment, a post 70 is formed on the output line 40 at some position in the x-axis direction. The post 70 is made of conductive material or dielectric material. The output line 40 and trigger line 60 are capacitively or inductively coupled via the post 70.

As the output lines 40 and trigger line 60 are capacitively coupled, a portion of a signal propagating along the output line 40 is positively fed back to the trigger line 60. Oscillation at a specific frequency is therefore possible. If this coupling capacitor is connected in parallel with an inductor, the coupling capacitor and inductor compose a parallel resonance circuit. This resonance circuit cancels a capacitance between the trigger line 40 and output line 60. Since this capacitance can be cancelled easily, a cancel type narrow band amplifier which is stable and has less feedback can be obtained.

Figure 7A:
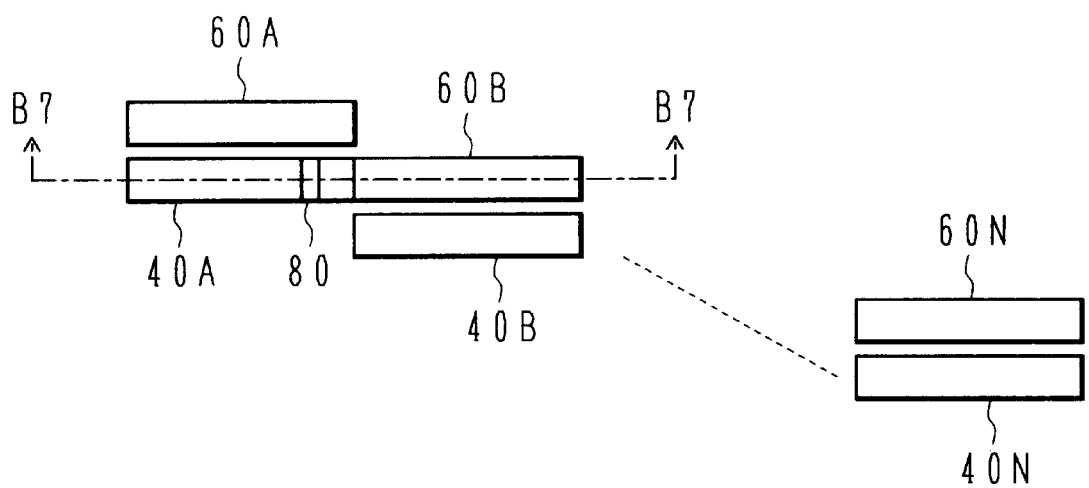
FIGS. 7A and 7B are respectively a plan view and a cross sectional view of a negative resistance line according to a third embodiment.
Figure 7B:
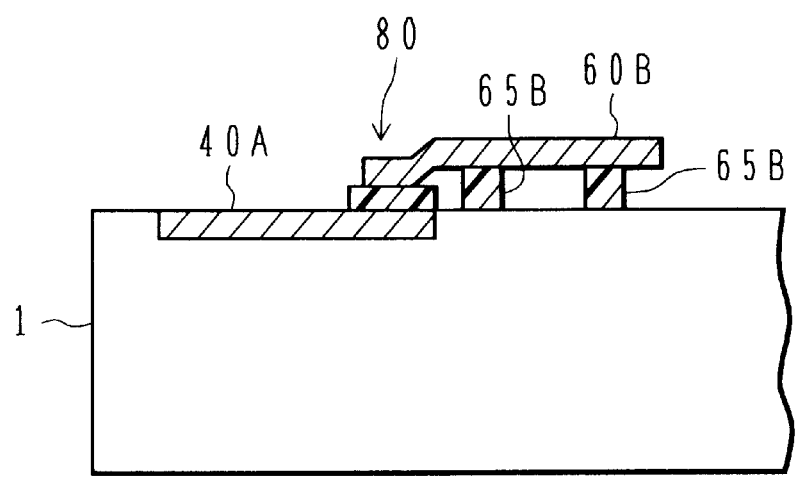

FIG. 7A is a plan view of a negative resistance line according to the third embodiment, and FIG. 7B is a cross sectional view taken along one-dot chain line B7—B7 shown in FIG. 7A. A negative resistance line at a first stage includes an output line 40A and a trigger line 60A, and a negative resistance line at a second stage includes an output line 40B, a trigger line 60B and columns 65B. Each of the negative resistance lines has the structure similar to the negative resistance line of the first embodiment shown in FIG. 2A.

An output terminal of the output line 40A of the first stage negative resistance line is connected via a capacitor 80 to an input terminal of the trigger line 60B of the second stage negative resistance line. The third and following negative resistance lines are disposed in a similar manner. By cascade-connecting a plurality of negative resistance lines in this manner, a power gain of a single negative resistance line multiplied by the number of stages can be theoretically obtained.

It is necessary to elongate the line length in order to obtain a large power gain. However, as apparent from the equation (7), as the line length W is made large, the power gain lowers if the attenuation constant $\alpha_g$ is large. With cascade connection, a large power gain can be obtained even if the attenuation constant is large.

For example, as seen from the equation (7), if the attenuation constant $\alpha_g$ is 0.6 mm$^-$, the power gain saturates at the line length of about 3 mm. The power gain of a cascaded negative resistance line having six cascaded unit negative resistance lines of 1 mm in length is about three times that of a negative resistance line of 6 mm in length.

The capacitor 80 is disposed in the width direction of the output line 40A and trigger line 60B and within the width range. With this structure, the characteristic impedances of the lines 40A and 60B do not change. A change in the propagation constant, a power reflection, and a lowered power gain to be caused by a change in the characteristic impedance can be avoided.

The capacitor 80 can be formed, for example, by the following method. As shown in FIG. 5H of the first embodiment, after the insides of the grooves 21 and 41 are buried with the conductive members 23 and 43, the resist film 8 is removed. A lamination film of Cr/Au is vapor deposited over the whole substrate surface. An $SiO_2$ film or an SiN film is deposited by sputtering on the Cr/Au lamination film. Another Cr/Au lamination film is vapor deposited. These layers are patterned to leave the capacitor 80 on the surface of the output line 40 near its output terminal.

Next, when the opening 67a is formed by the process shown in FIG. 5K of the first embodiment, another opening is formed to expose the upper electrode of the capacitor 80. The input terminal of the next stage trigger line is connected via this opening to the upper electrode of the capacitor 80.

Figure 8A:
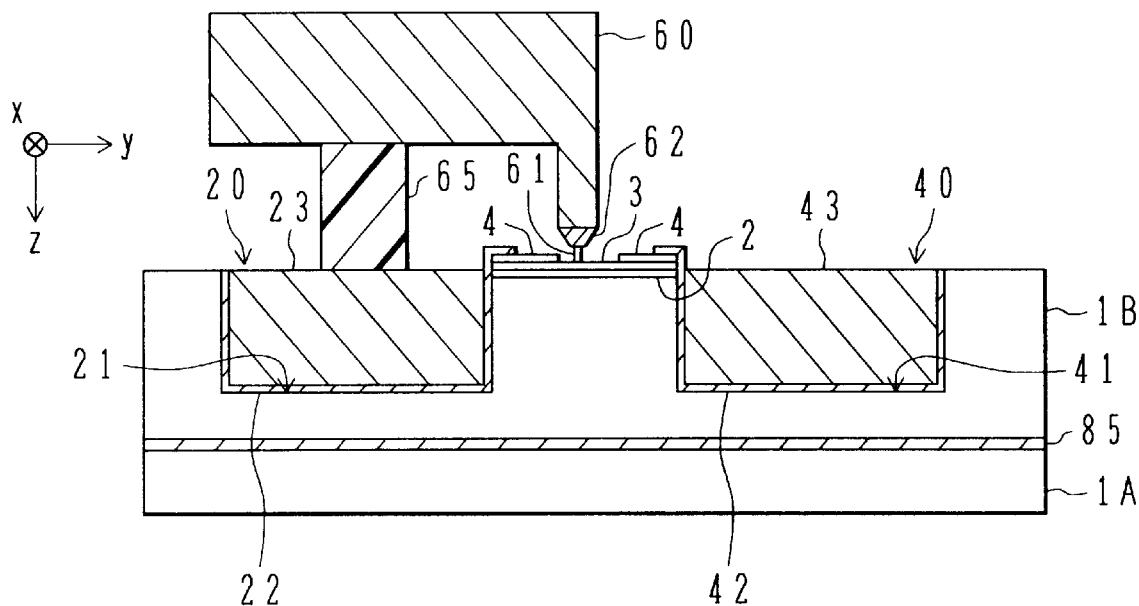
FIGS. 8A and 8B are respectively a cross sectional view and a partially broken perspective view of a negative resistance line according to a fourth embodiment.

FIG. 8A is a cross sectional view of a negative resistance line according to the fourth embodiment. A two-dimensional electron gas layer 85 is formed at the position deeper than the lower surfaces of a common line 20 and an output line 40. This two-dimensional electron gas layer 85 is formed, for example, by the following method.

On the surface of a GaAs substrate 1A, an InGaAs layer and an n$^+$-type AlGaAs layer are deposited by molecular beam epitaxy (MBE). A GaAs layer 1B is then deposited on the AlGaAs layer. The two-dimensional electron gas layer 85 is therefore formed at the interface between the InGaAs layer and n$^+$-type AlGaAs layer. The GaAs layer 1B is formed by MBE, MO-CVD or liquid phase crystal growth. In order to form a thick GaAs layer, the liquid phase crystal growth is preferable.

Electromagnetic waves are confined in the space between the common line 20 and two-dimensional electron gas layer 85 and in the space between the output line 40 and two-dimensional electron gas layer 85. A confinement efficiency of electromagnetic waves can be raised. This embodiment is effective in that the power propagation efficiency can be raised for electromagnetic waves having a wavelength higher than tera Hz.

Figure 8B:
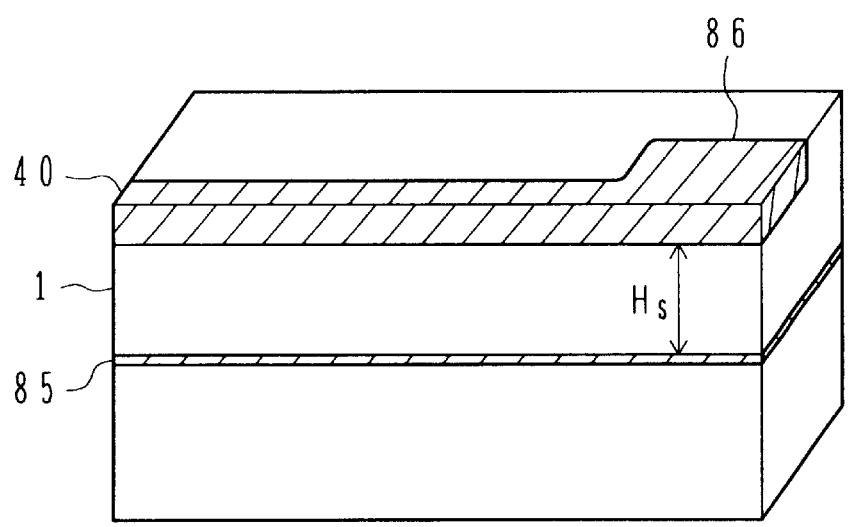

FIG. 8B is a partially broken perspective view of the output line 40 near its output terminal. A signal pickup electrode 86 is continuous with the output terminal of the output line 40. A distance between the signal pickup electrode 86 and two-dimensional electron gas layer 85 is represented by $H_s$. An effective thickness of the substrate is equal to the distance $H_s$ between the signal pickup electrode 86 and two-dimensional electron gas layer 85. A radiation power loss can be reduced which increases in inverse proportion to a square of a ratio of a wavelength $\lambda$ to a substrate thickness h, i.e., $(\lambda/h)^2$.

FIG. 9A is a plan view showing a negative resistance line according to the fifth embodiment, and FIG. 9B is a cross sectional view taken along one-dot chain line B9—B9 shown in FIG. 9A.

As shown in FIG. 9B, common lines 20A and 20B are disposed on both sides of a single output line 40 formed in a surface layer of a substrate 1. Trigger lines 60A and 60B are respectively disposed over the common lines 20A and 20B. The trigger lines 60A and 60B are respectively supported on the common lines 20A and 20B by columns 65A and 65B. Two negative resistance lines having the structure similar to the negative resistance line of the first embodiment share the single output line 40.

Signals having frequencies $f_1$ and $f_2$ are applied to signal input terminals $T_{i1}$ and $T_{i2}$ of the trigger lines 60A and 60B. A signal having a frequency of $f_1+f_2$ and a signal having a frequency of $f_1-f_2$ are output from an output terminal $T_o$ of the output line 40. The output powers of the two negative resistance lines are synthesized so that a power gain of about two times that of a single negative resistance line can be obtained.

Figure 10:
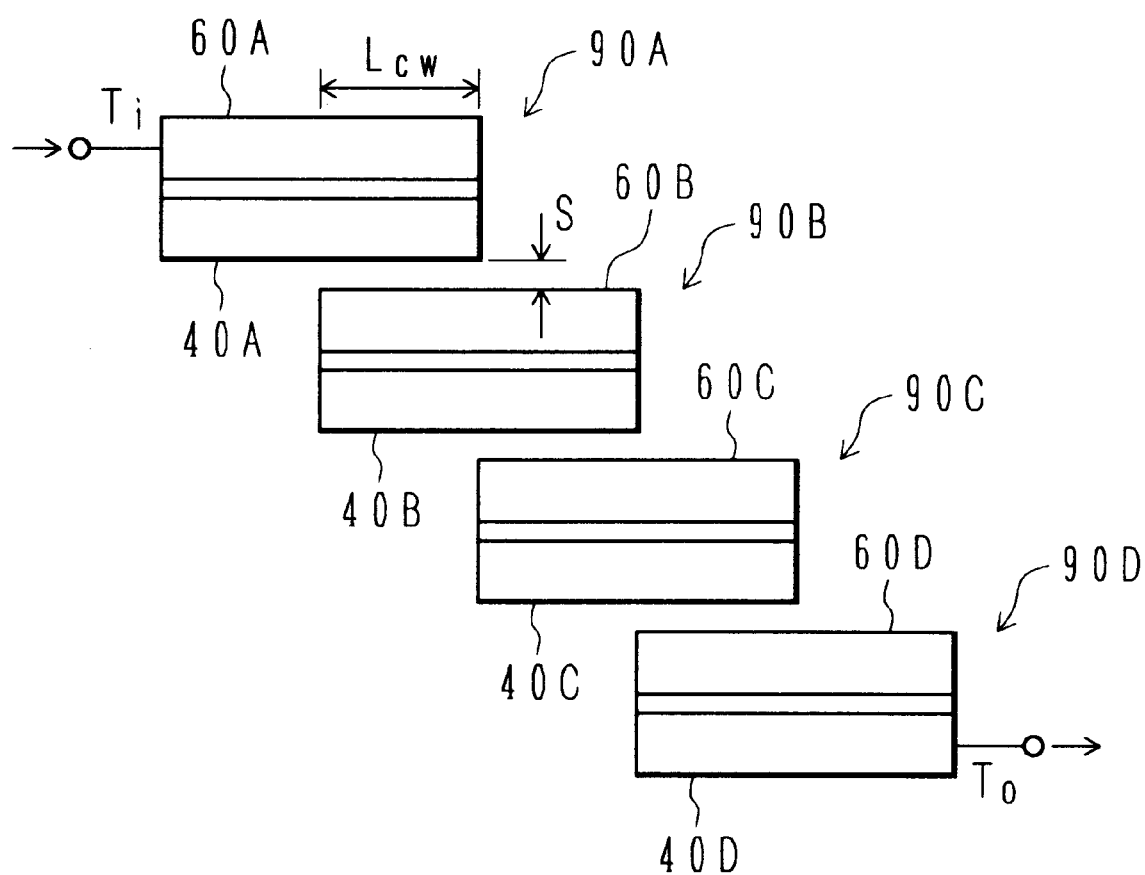
FIG. 10 is a plan view of a negative resistance line according to a sixth embodiment.

FIG. 10 is a plan view of a band-pass filter according to the sixth embodiment. The band-pass filter of the sixth embodiment has four negative resistance lines of the first embodiment. A trigger line 60A and an output line 40A constitute a first negative resistance line 90A. Similarly, a trigger line 60B and an output line 40B constitute a second negative resistance line 90B, a trigger line 60C and an output line 40C constitute a third negative resistance line 90C, and a trigger line 60D and an output line 40D constitute a fourth negative resistance line 90D.

A portion near the output terminal of the output line 40A of the first negative resistance line 90A is disposed in parallel to a portion near the input terminal of the trigger line 60B of the second negative resistance line 90B, with a space S being set therebetween. A length overlapping in the length direction is represented by $L_{cw}$. With this structure, the output line 40A and trigger line 60B are electromagnetically coupled. Similarly, the lines from the second negative resistance line 90B to the fourth negative resistance line 90D are sequentially coupled magnetically.

An electric signal is applied to the input terminal $T_i$ of the trigger line 60A of the first negative resistance line 90A. Specific frequency components of the signal power-amplified by the first negative resistance line 90A are propagated to the trigger line 60B of the second negative resistance line 90B. This operation is repeated and a power-amplified signal is output from the output terminal $T_o$ of the fourth negative resistance line 90D. The band-pass characteristics of this filter are defined by the space S and length $L_{cw}$ of a coupling area between the output line and the next stage trigger line.

A loss in a conventional filter made of passive elements becomes larger as the number of elements increases. The band-pass filter of the sixth embodiment is not associated with this problem of power loss even if the number of elements (in this case, the number of negative resistance lines) is increased, because each negative resistance line performs power amplification.

Figure 11:
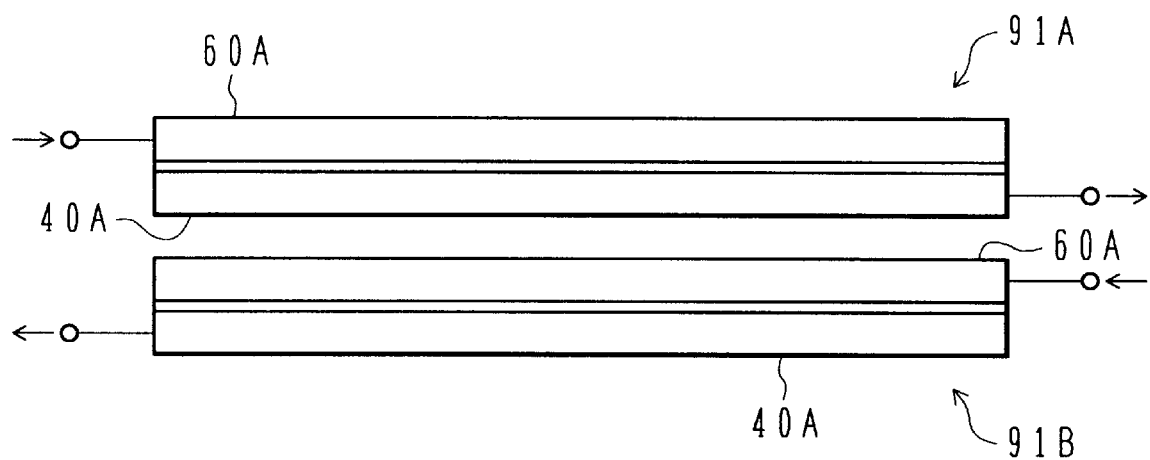
FIG. 11 is a plan view of a directional line according to a seventh embodiment.

FIG. 11 is a plan view of a directional line according to the seventh embodiment. This directional line of the seventh embodiment has negative resistance lines 91A and 91B of the first embodiment disposed in parallel with a space therebetween. A signal propagation direction of one negative resistance line 91A is opposite to a signal propagation direction of the other negative resistance line 91B. If the space therebetween is set to 4 μm, isolation between the lines can be made sufficiently high.

Figure 12:
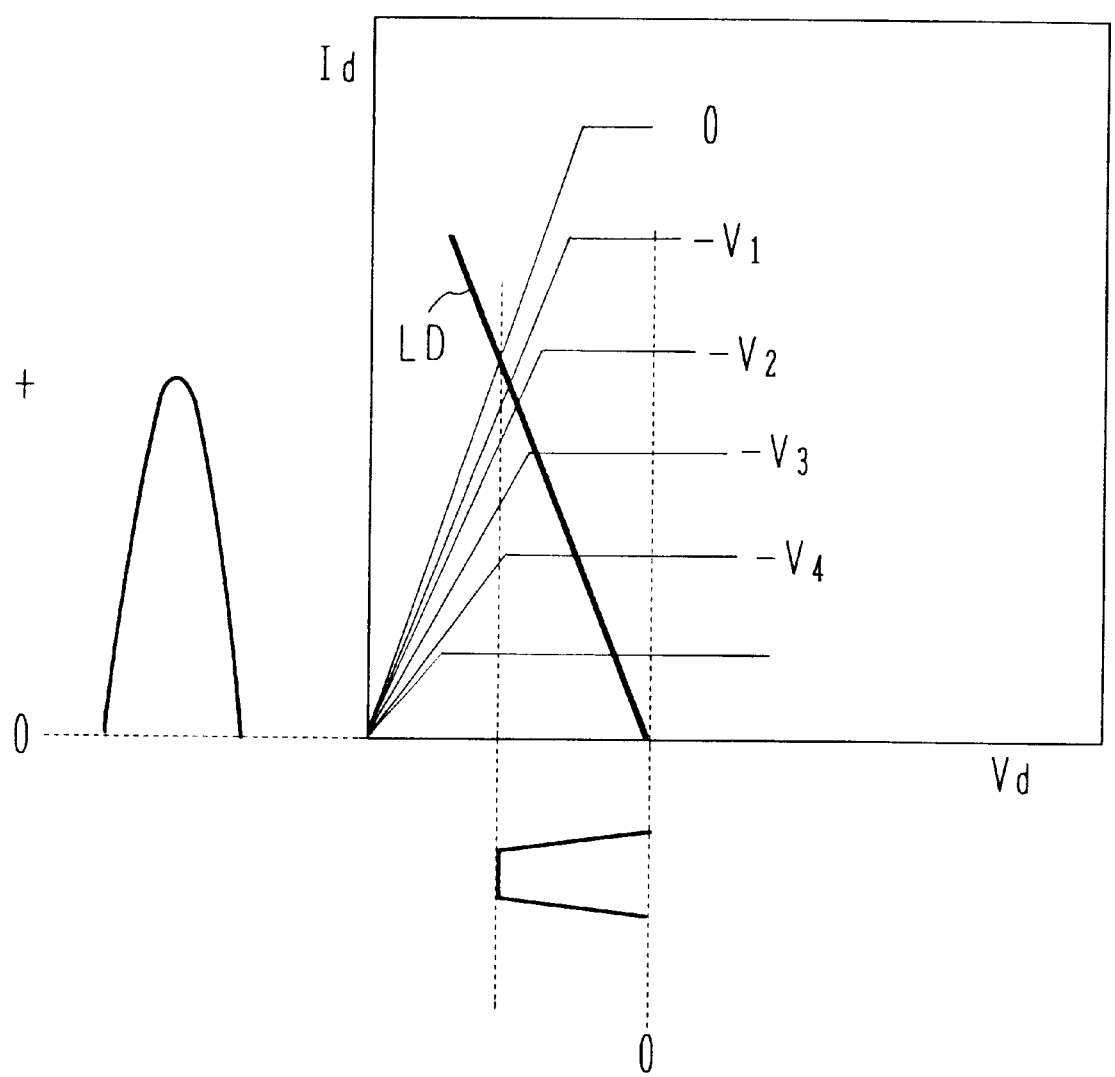
FIG. 12 is a graph showing the drain voltage-current characteristics of HEMT constituting a negative resistance line used for a pulse generator according to an eighth embodiment.

FIG. 12 is a graph showing the drain voltage-current characteristics illustrating a method of generating a pulse by a pulse generator according to the eighth embodiment. This pulse generator has the structure similar to the negative resistance line of the first embodiment. The abscissa of FIG. 12 represents a drain voltage $V_d$ and the ordinate represents a drain current $I_d$. The operating point shown in FIG. 4 is approximately at the center of the load line LD, and the operating point shown in FIG. 12 is at the lower end of a load line LD.

As a sine wave is applied to the gate electrode (trigger line), a pulse voltage appears at the drain electrode (output line). By using the negative resistance line, both the generation of a pulse wave and power amplification can be realized.

Figure 13A:
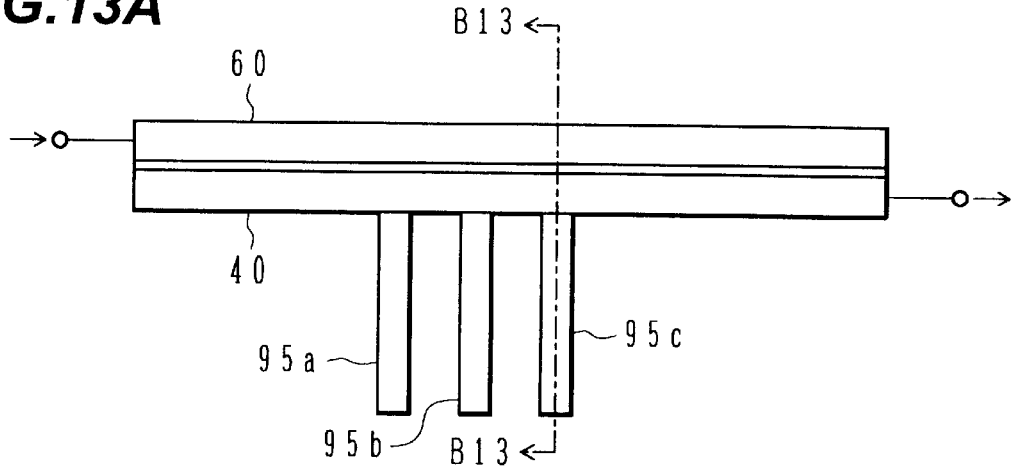
FIGS. 13A and 13B are respectively a plan view and a cross sectional view of a band-elimination circuit according to a ninth embodiment.
Figure 13B:
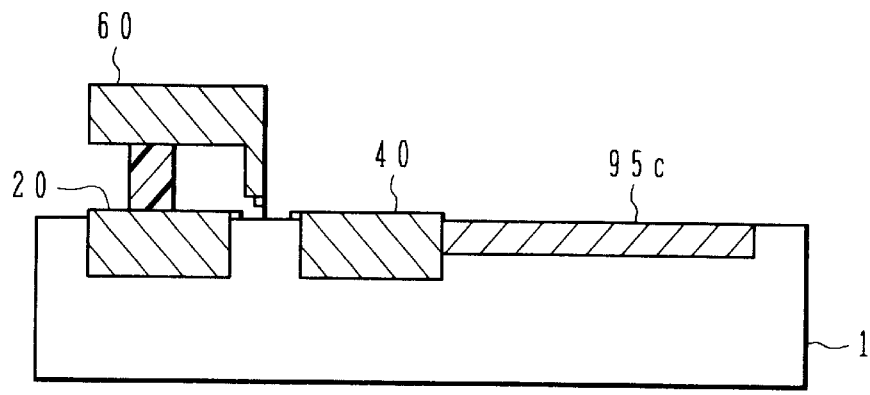

FIG. 13A is a plan view of a band-elimination circuit according to the ninth embodiment. FIG. 13B is a cross sectional view taken along one-dot chain line B13—B13 shown in FIG. 13A. A common line 20, an output line 40, a trigger line 60 and the like constitute the negative resistance line of the first embodiment. Stubs 95a, 95b and 95c are formed at intermediate positions of the output line 40 at a predetermined pitch. The stubs 95a, 95b and 95c are formed at the same time when the output line 40 is formed.

Figure 13C:
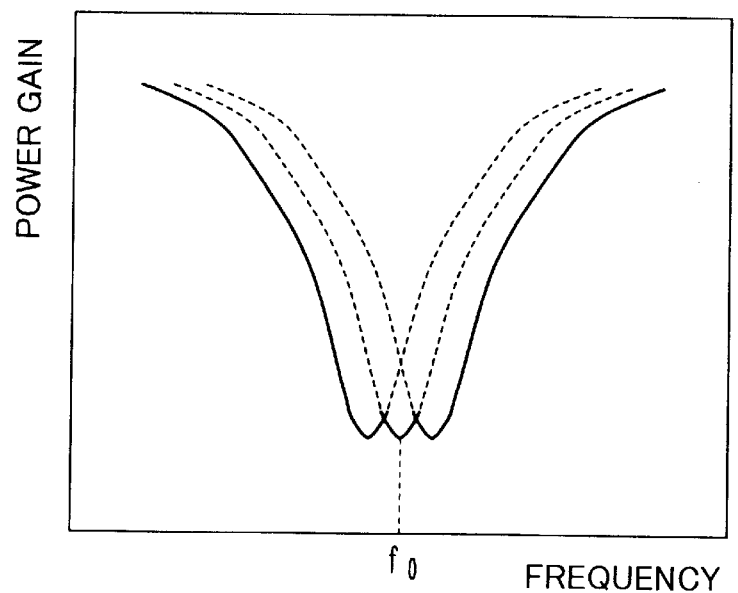
FIG. 13C is a graph showing the frequency dependency characteristics of power gains of the band-elimination circuit.

FIG. 13C is a graph showing the frequency dependency characteristics of a power gain of the band-elimination circuit shown in FIGS. 13A and 13B. Three dotted lines each having a valley near a frequency $f_o$ indicate power gains lowered by the stubs 95a to 95c. The shape of each dotted line is defined by the length of a stub, and a shift of the center frequency of each dotted line is defined by a pitch of the stubs.

The power gain of this band-elimination circuit is the synthesized power gains indicated by the three dotted lines. The band-elimination circuit of the ninth embodiment using the negative resistance line can realize both band elimination and power amplifier.

The present invention has been described in connection with the preferred embodiments. The invention is not limited only to the above embodiments. It is apparent that various modifications, improvements, combinations, and the like can be made by those skilled in the art.

What is claimed is:

1. A distributed constant line comprising:
    an active element including first and second regions and a control electrode, carriers moving between the first and second regions in a first direction and a motion of carriers being controlled by an electric signal applied to the control electrode, the first and second regions and the control electrode extending in a second direction crossing the first direction from an input terminal to an output terminal;
    a conductive region electrically connected to the first region from the input terminal to the output terminal;
    a trigger line extending in the second direction for propagating an electric signal from the input terminal to the output terminal in the second direction, the electric signal propagating the trigger line being applied to said control electrode at a corresponding position in the second direction; and
    an output line extending in the second direction for propagating an electric signal from the input terminal to the output terminal in the second direction, the electric signal propagating on said output line in the second direction being excited by carriers moving through said active element in the first direction.

2. A distributed constant line according to claim 1, wherein a wavelength constant of said output line is approximately equal to a wavelength constant of said trigger line.

3. A distributed constant line according to claim 1, wherein said active element is a field effect transistor, the first region is a source region thereof, the second region is a drain region, and the control electrode is a gate electrode.

4. A distributed constant line according to claim 3, wherein a mutual conductance of said active element is larger than a drain conductance.

5. A distributed constant line according to claim 1, wherein said trigger line is disposed spaced by a constant distance from said conductive region.

6. A distributed constant line according to claim 5, further comprising a plurality of columns disposed between said trigger line and said conductive region for maintaining the distance therebetween constant, said columns being dispersively disposed in the second direction.

7. A distributed constant line according to claim 1, wherein said output line is disposed spaced by a constant distance from said conductive region.

8. A distributed constant line according to claim 1, further comprising:

a substrate having said conductive region, said output line and said active element formed in a surface layer of said substrate; and a two-dimensional electron gas layer formed in said substrate at a position deeper than a deepest level of said conductive region and said output line.

9. A distributed constant line according to claim 1, wherein said active element is a high electron mobility transistor, and $Y_p/d$ is 2 or larger where $Y_p$ is a distance between a gate electrode of the high electron mobility transistor and an edge of a two-dimensional electron gas layer on a drain side and d is a distance in a depth direction from the gate electrode and the two-dimensional electron gas layer.

10. A distributed constant line according to claim 1, further comprising a stub formed at an intermediate position of said output line.

11. A distributed constant line according to claim 1, wherein at least two distributed constant lines are disposed, an output terminal of said output line of a first distributed constant line is electromagnetically coupled to an input terminal of said trigger line of a second distributed constant line.

12. A distributed constant line according to claim 11, wherein the output terminal of said output line of the first distributed constant line is coupled via a capacitor to said trigger line of the second distributed line, and an area occupied by the capacitor is in a width area of said output line and said trigger line connected by the capacitor.

13. A distributed constant line according to claim 1, wherein at least two distributed constant lines are disposed, a portion near an output terminal of said output line of a first distributed constant line overlaps in a length direction a portion near an input terminal of said trigger line of a second distributed constant line, and the first and second distributed constant lines are disposed spaced by some distance in a width direction.

14. A distributed constant line according to claim 1, wherein at least two distributed constant lines are disposed, and the two distributed constant lines share a single output line.

* * * * *